(12) United States Patent
Park et al.

(10) Patent No.: US 12,132,101 B2
(45) Date of Patent: Oct. 29, 2024

(54) SEMICONDUCTOR DEVICES

(71) Applicant: Samsung Electronics Co., Ltd., Suwon-si (KR)

(72) Inventors: Beomjin Park, Hwaseong-si (KR); Dongwon Kim, Seongnam-si (KR); Bongseok Suh, Seoul (KR); Daewon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 418 days.

(21) Appl. No.: 17/568,170

(22) Filed: Jan. 4, 2022

(65) Prior Publication Data

US 2022/0320312 A1 Oct. 6, 2022

(30) Foreign Application Priority Data

Mar. 30, 2021 (KR) ........................ 10-2021-0040881

(51) Int. Cl.
*H01L 29/66* (2006.01)
*H01L 29/10* (2006.01)
*H01L 29/417* (2006.01)
*H01L 29/78* (2006.01)

(52) U.S. Cl.
CPC ...... *H01L 29/6681* (2013.01); *H01L 29/1033* (2013.01); *H01L 29/41791* (2013.01); *H01L 29/7851* (2013.01)

(58) Field of Classification Search
CPC ............. H01L 29/6681; H01L 29/1033; H01L 29/41791; H01L 29/7851
See application file for complete search history.

(56) References Cited

U.S. PATENT DOCUMENTS

| | | | |
|---|---|---|---|
| 9,634,092 B2 | 4/2017 | Bhuwalka et al. | |
| 9,748,394 B2 | 8/2017 | Chang et al. | |
| 9,899,364 B2* | 2/2018 | Blatchford | ...... H01L 21/823425 |
| 10,566,331 B1 | 2/2020 | Yang et al. | |
| 10,665,669 B1 | 5/2020 | Xie et al. | |
| 10,734,224 B2 | 8/2020 | Smith et al. | |
| 10,741,659 B2* | 8/2020 | Yoon | ............... H01L 21/823821 |
| 10,811,304 B2 | 10/2020 | Sung et al. | |
| 10,825,898 B2 | 11/2020 | Tsai et al. | |
| 2006/0049429 A1 | 3/2006 | Kim et al. | |
| 2017/0317213 A1* | 11/2017 | Park | ....................... H01L 29/785 |

(Continued)

*Primary Examiner* — Mark W Tornow
(74) *Attorney, Agent, or Firm* — Harness, Dickey & Pierce, P.L.C.

(57) ABSTRACT

A semiconductor device includes a first and second active regions extending in a first direction and having respective first and second widths in a second direction, the second width greater than the first width, a connection region connected to the first and second active regions and having a third width, between the first and second widths in the second direction, first and second gate structures respectively intersecting the first and second active regions and extending in the second direction, and a dummy structure intersecting at least a portion of the connection region, extending in the second direction, and between the first and second gate structures in the first direction. The dummy structure includes first and second pattern portions spaced apart from a side surface of the first gate structure by respective first and second distances in the first direction, the second distance greater than the first distance.

20 Claims, 26 Drawing Sheets

(56) References Cited

U.S. PATENT DOCUMENTS

| | | | |
|---|---|---|---|
| 2018/0040699 A1* | 2/2018 | Ha | H01L 29/785 |
| 2020/0091349 A1* | 3/2020 | Kang | H10B 10/12 |
| 2020/0168825 A1 | 5/2020 | van Dal et al. | |
| 2020/0343364 A1* | 10/2020 | Kim | H01L 21/823431 |
| 2022/0320312 A1* | 10/2022 | Park | H01L 27/088 |
| 2022/0344329 A1* | 10/2022 | Seo | H01L 29/41791 |
| 2022/0375934 A1* | 11/2022 | Park | H01L 29/66545 |

* cited by examiner

SEMICONDUCTOR DEVICES

CROSS-REFERENCE TO RELATED APPLICATIONS

This application claims the benefit under 35 U.S.C. § 119 of Korean Patent Application No. 10-2021-0040881 filed on Mar. 30, 2021 in the Korean Intellectual Property Office, the entire disclosure of which is incorporated herein by reference for all purposes.

BACKGROUND

The present inventive concepts relate to semiconductor devices.

As demand for high performance, high speed, and/or multifunctionality of semiconductor devices increases, the degree of integration of the semiconductor device is increasing. In manufacturing a semiconductor device having a fine pattern corresponding to the trend for high integration of semiconductor devices, it is necessary to implement patterns having a fine width or a fine separation distance. In addition, in order to reduce the limitations of operating characteristics due to the size reduction of planar metal oxide semiconductor FETs, efforts are being made to develop semiconductor devices including FinFETs having a three-dimensional channel structure.

SUMMARY

Some example embodiments provide a semiconductor device having improved electrical characteristics and reliability characteristics.

According to some example embodiments, a semiconductor device may include a first active region extending in a first direction and having a first width in a second direction. The second direction may be perpendicular to the first direction. The semiconductor device may include a second active region extending in the first direction and having a second width in the second direction. The second width may be greater than the first width. The semiconductor device may include a connection region connected to both of the first active region and the second active region. The connection region may have a third width in the second direction. The third width may be greater than the first width and less than the second width. The semiconductor device may include a first gate structure intersecting the first active region and extending in the second direction, a second gate structure intersecting the second active region and extending in the second direction, and a dummy structure intersecting at least a portion of the connection region. The dummy structure may extend in the second direction. The dummy structure may be between the first and second gate structures in the first direction. The semiconductor device may include source/drain regions on the first active region, the second active region, and the connection region. The source/drain regions may be on at least one side of each of the first and second gate structures and at least one side of the dummy structure. The dummy structure may include a first pattern portion isolated from direct contact with a side surface of the first gate structure by a first distance in the first direction, and a second pattern portion isolated from direct contact with the side surface of the first gate structure by a second distance in the first direction, the second distance being greater than the first distance.

According to some example embodiments, a semiconductor device may include an active region extending in a first direction on a substrate. The active region may include a first active region having a first width in a second direction, a second active region having a second width in the second direction, and a connection region between the first active region and the second active region. The second direction may be perpendicular to the first direction. The second width may be greater than the first width. The connection region may have an inclined surface at least partially defined by a difference between the first width and the second width. The semiconductor device may include a gate structure intersecting the first active region and extending in the second direction, and a dummy structure intersecting the connection region. The dummy structure may extend in the second direction. The dummy structure may be adjacent to the gate structure. The semiconductor device may include a first source/drain region on the connection region. The first source/drain region may be between a first side of the gate structure and a first side of the dummy structure. The semiconductor device may include a second source/drain region on the first active region. The second source/drain region may be on a second side of the gate structure opposing the first side. The first source/drain region may have a first length in the first direction. The second source/drain region may have a second length in the first direction. The first length may be less than the second length.

According to some example embodiments, a semiconductor device may include an active region extending in a first direction on a substrate. The active region may include a first active region having a first width in a second direction, a second active region having a second width in the second direction, and a connection region between the first active region and the second active region. The second direction may be perpendicular to the first direction. The second width may be greater than the first width. The connection region may have an inclined surface at least partially defined by a difference between the first width and the second width. The semiconductor device may include a first gate structure intersecting the first active region and extending in the second direction, a plurality of first channel layers on the first active region, a second gate structure intersecting the second active region and extending in the second direction, and a plurality of second channel layers on the second active region. The plurality of first channel layers may be vertically spaced apart from each other. The plurality of first channel layers may be at least partially surrounded by the first gate structure. The plurality of second channel layers may be vertically spaced apart from each other. The plurality of second channel layers may be at least partially surrounded by the second gate structure. The semiconductor device may include a dummy structure intersecting the connection region. The dummy structure may extend in the second direction. The dummy structure may be between the first and second gate structures in the first direction. The dummy structure may include a first pattern portion isolated from direct contact with a side surface of the first gate structure by a first distance in the first direction, and a second pattern portion isolated from direct contact with the side surface of the first gate structure by a second distance in the first direction. The second distance may be greater than the first distance.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1A:
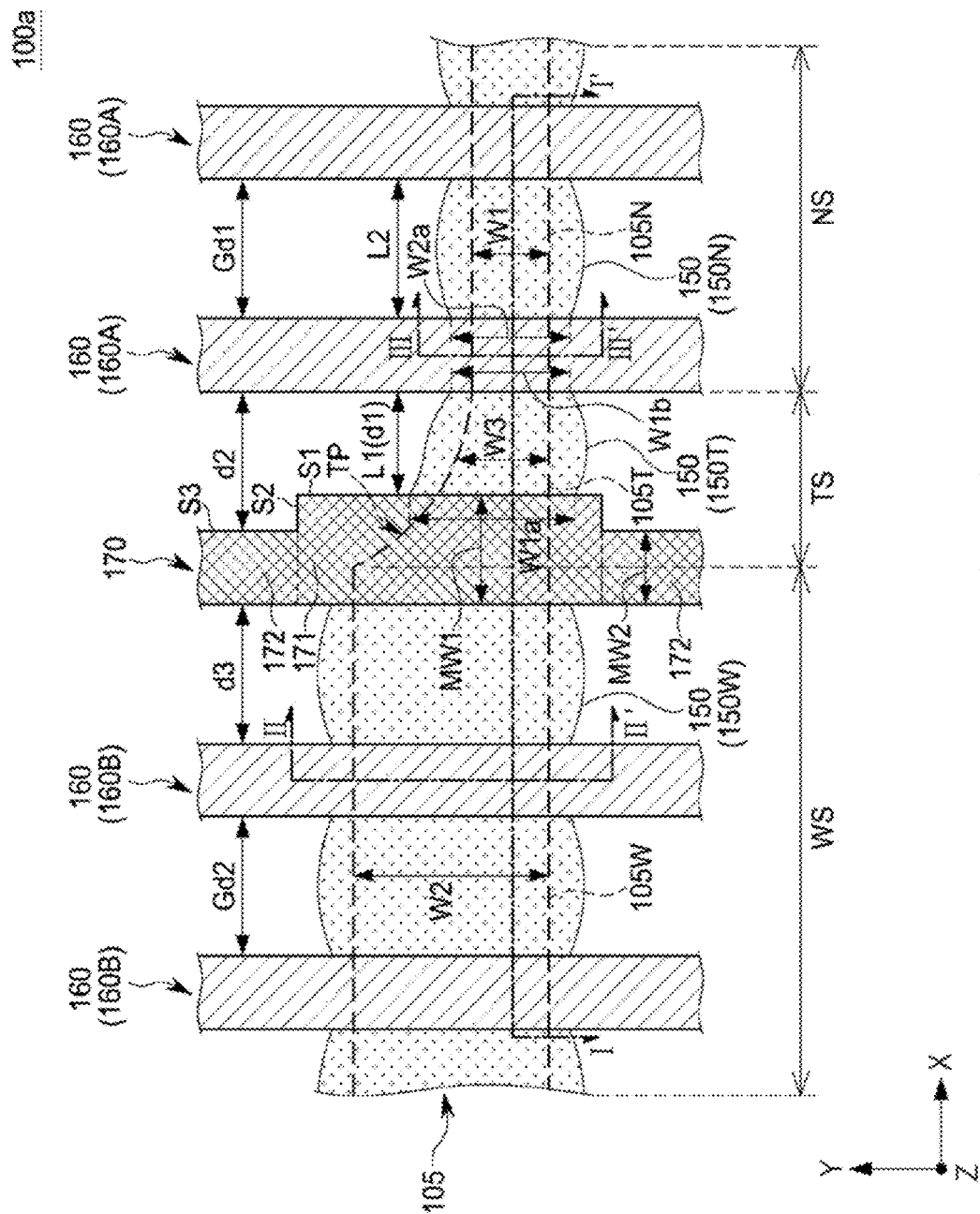
FIG. 1A is a plan view illustrating a semiconductor device according to some example embodiments.

Hereinafter, some example embodiments will be described in detail with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1A is a plan view illustrating a semiconductor device according to some example embodiments.

Figure 1B:
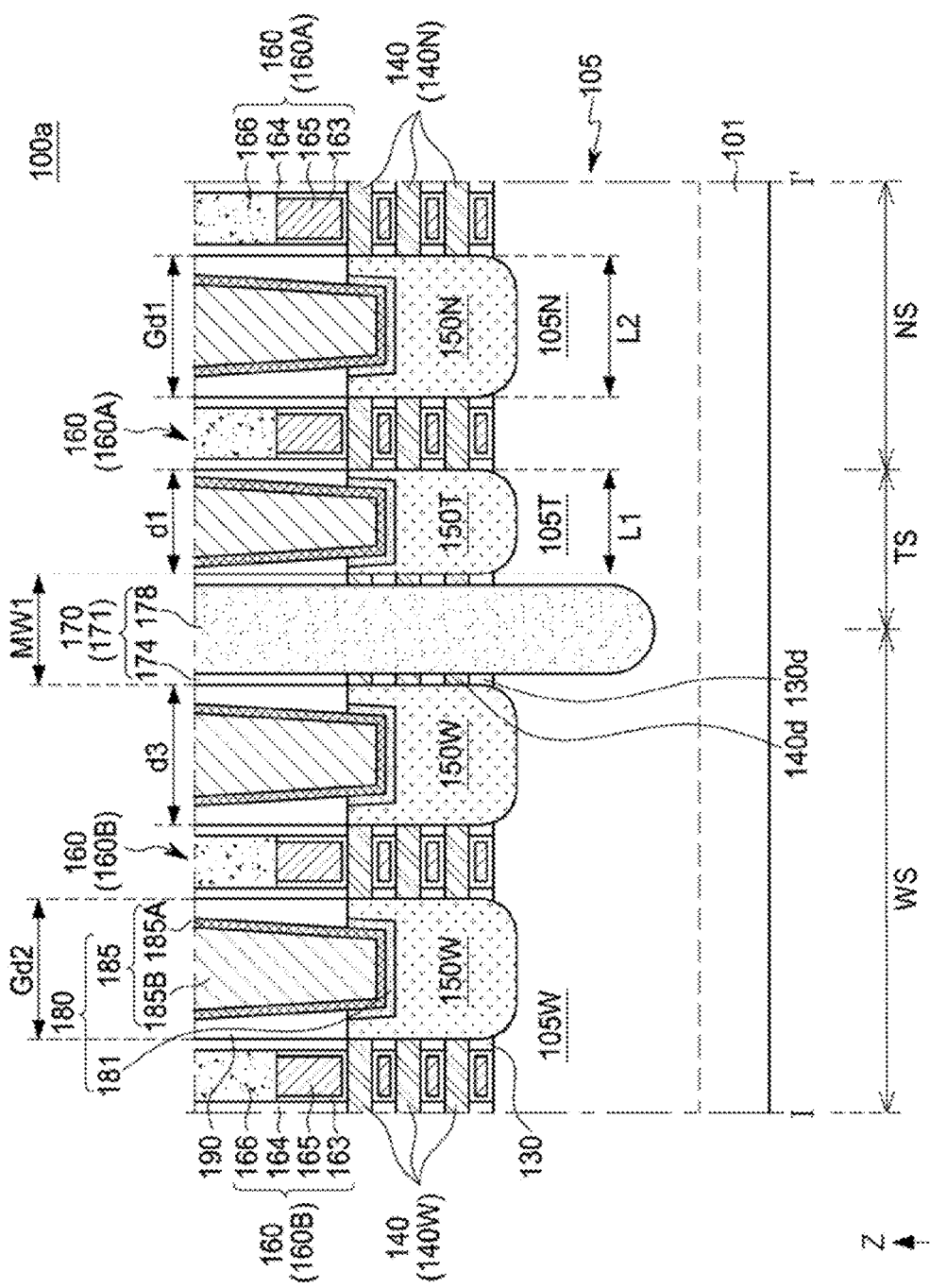
FIGS. 1B and 1C are cross-sectional views illustrating a semiconductor device according to some example embodiments.
Figure 1C:
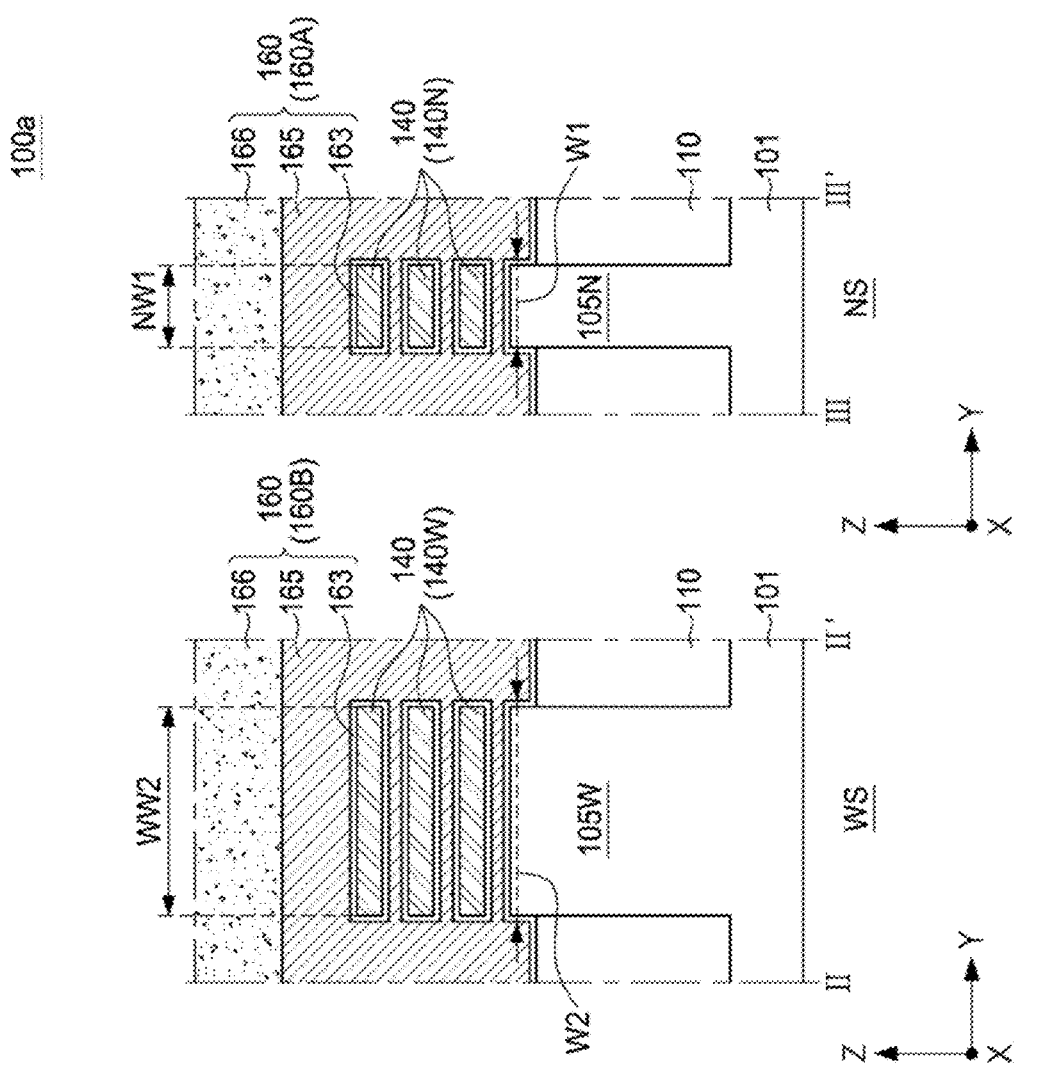

FIGS. 1B and 1C are cross-sectional views illustrating a semiconductor device according to some example embodiments. FIG. 1B illustrates a cross-section of the semiconductor device of FIG. 1A taken along line I-I' shown in FIG. 1A. FIG. 1C illustrates cross-sections of the semiconductor device of FIG. 1A taken along lines II-II' and shown in FIG. 1A. For convenience of description, only major components of the semiconductor device are illustrated in FIG. 1A.

Referring to FIGS. 1A to 1C, a semiconductor device 100a may include a substrate 101, an active region 105 and channel layers 140 on the substrate 101, and source/drain regions 150 on the active region 105, and gate structures 160 and a dummy structure 170 intersecting the active region 105. The semiconductor device 100a may further include a device isolation layer 110, an inner spacer layer 130, a contact structure 180, and an interlayer insulating layer 190.

In the semiconductor device 100a, the active region 105 may have a fin structure, and a gate electrode 165 of the gate structure 160 may be disposed between the active region 105 and the channel layers 140, between the channel layers 140, and on an upper portion of the channel layers 140. Accordingly, the semiconductor device 100a may include a multi-bridge channel FET (MBCFET™) comprising the channel layers 140, the source/drain regions 150, and the gate electrode 165.

However, the present inventive concepts is not limited thereto, and for example, may provide a FinFET which is a transistor in which the active region 105 may have a fin structure and a channel region of the transistor is formed in the active region 105 intersecting the gate electrode 165. The present inventive concepts may also provide, for example, a vertical Field Effect Transistor (FET) in which the active region 105 extending perpendicularly to the upper surface of the substrate 101 and the gate structure 160 surrounding the side surface of the active region 105 are disposed.

The substrate 101 may include a semiconductor material, for example, a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon on insulator (SOI) layer, a semiconductor on insulator (SeOI) layer, or the like.

The active region 105 is defined by the device isolation layer 110 in the substrate 101 and may be disposed to extend in a first direction, for example, an X-direction. The active region 105 may have a structure protruding from the substrate 101. The upper end of the active region 105 may be disposed to protrude by a particular (or, alternatively, predetermined) distance from the upper surface of the device isolation layer 110. The active region 105 may be formed as a part of the substrate 101, or may include an epitaxial layer grown from the substrate 101. Merely, on both sides of the gate structure 160, the active region 105 on the substrate 101 may be partially recessed, and the source/drain regions 150 may be disposed on the recessed active region 105. Accordingly, as illustrated in FIG. 1B, the active region 105 below the channel layers 140 and the gate structure 160 may have a relatively high height. In some embodiments, the active region 105 may include impurities, and at least portions of the active regions 105 may include impurities of different conductivity types, but is not limited thereto. The active region 105 may be provided as a plurality of active regions 105 spaced apart from each other in the second direction, for example, the Y-direction.

The active region 105 may include a first active region 105N extending in the X-direction (also referred to herein as a first direction) and having a first width W1 in the Y-direction (also referred to herein as a second direction that is perpendicular to the first direction), a second active region 105W extending in the X-direction and having a second width W2 greater (e.g., greater in magnitude) than the first width W1 in the Y-direction (e.g., the second width W2 in the Y-direction may be greater in magnitude than the first width W1 in the Y-direction), and a connection region 105T having a third width W3 greater (e.g., larger) than the first width W1 and less (e.g., smaller) than the second width W2 in the Y-direction (e.g., the third width W3 in the Y-direction may be greater in magnitude than the first width W1 in the Y-direction and smaller in magnitude than the second width W2 in the Y-direction). The X-direction and the Y-direction may be perpendicular to each other. The connection region 105T may be a region that connects (e.g., is connected to both of) the first active region 105N and the second active region 105W having different widths in the Y-direction, to each other. The first active region 105N, the second active region 105W, and the connection region 105T may be integrally formed to form a continuous structure.

As illustrated in FIG. 1A, the connection region 105T may provide a tapered or inclined side surface TP by a portion having a variable width in the Y-direction. Restated, and as shown in at least FIG. 1A, the connection region 105T may include a portion having a width in the Y-direction that varies in the X-direction, and the portion of the connection region 105T may at least partially define such a tapered or inclined side surface TP based on the variation, in the X-direction, of the width in the Y-direction of the portion of the connection region. For example, the connection region 105T may have the inclined surface TP due to (e.g., at least partially defined by) a difference between the first width W1 and the second width W2. The width of the connection region 105T in the Y-direction may continuously decrease from the second active region 105W toward the first active region 105N. At least one sides of each of the connection region 105T, the first active region 105N and the second active region 105W may be disposed on a straight line, but the configuration is not limited thereto.

The semiconductor device 100a may provide transistors having different characteristics through the first active region 105N and the second active region 105W having different widths. For example, the first active region 105N may constitute a first transistor having a narrow channel width in a narrow fin region NS, and the second active region 105W may constitute a second transistor having a wide channel width in a wide fin region WS. The connection region 105T may be disposed in a transition region TS, which is a region in which a width of a fin changes in one active region 105.

The device isolation layer 110 may define the active region 105 in the substrate 101. The device isolation layer 110 may be formed by, for example, a shallow trench isolation (STI) process. The device isolation layer 110 may expose upper sidewalls of the active region 105. The device isolation layer 110 may extend in the Y-direction and may cover lower portions of side surfaces (e.g., each side surface) of each of the first and second active regions 105N and 105W and the connection region 105T. In some embodiments, the device isolation layer 110 may include a region disposed between the active regions 105 and extending relatively deeper into the lower portion of the substrate 101. The device isolation layer 110 may have a curved upper surface having a higher level as it approaches the active region 105, but the shape of the upper surface of the device isolation layer 110 is not limited thereto. The device isolation layer 110 may be formed of an insulating material. The device isolation layer 110 may be formed of, for example, an oxide, a nitride, or a combination thereof.

The channel layers 140 may include two or more layers disposed on the active region 105 to be spaced apart from each other in a direction perpendicular to the upper surface of the active region 105, for example, in the Z-direction. The plurality of layers is configured as three layers in the drawing, but is not limited thereto, and may be configured as, for example, four layers. The channel layers 140 may be spaced apart from the upper surface of the active region 105 while being connected to the source/drain region 150. The channel layers 140 may have the same or similar width as that of the active region 105 in the Y-direction, and may have the same or similar width as that of the gate structure 160 in the X-direction. The channel layers 140 may be formed of a semiconductor material, and may include at least one of, for example, silicon (Si), silicon germanium (SiGe), and germanium (Ge). The channel layers 140 may be formed of, for example, the same material as the substrate 101. The dummy channel layers 140d may be disposed to contact the periphery of the insulating isolation pattern 178 of the dummy structure 170, but the configuration is not limited thereto.

The channel layers 140 may include first channel layers 140N on the first active region NS and second channel layers 140W on the second active region WS. As shown in FIGS. 1A-1C, the first channel layers 140N may be on the first active region 105N, may be vertically spaced apart from each other in the Z-direction (e.g., isolated from direct contact with each other in the Z-direction while at least partially overlapping each other in the Z-direction), and may be at least partially surrounded by the first gate structure 160A. As further shown in FIGS. 1A-1C, the second channel layers 140W may be on the second active region 105W, may be vertically spaced apart from each other in the Z-direction (e.g., isolated from direct contact with each other in the Z-direction while at least partially overlapping each other in the Z-direction), and may be at least partially surrounded by the second gate structure 160B. The first channel layers 140N may have a first width NW1 in the Y-direction that is equal to or similar to the first width W1 of the first active region NS in the Y-direction. The second channel layers 140W may have a second width WW2 in the Y-direction that is equal to or similar to the second width W2 of the second active region WS. The first width NW1 of the first channel layers 140N may be less than the second width WW2 of the second channel layers 140W.

The semiconductor device 100a may provide transistors having different characteristics through the first channel layer 140N and the second channel layer 140W having different widths. For example, the first channel layer 140N may constitute a first transistor having the narrow channel width NW1 in the narrow fin region NS, and the second channel layer 140W may constitute a second transistor having the wide channel width WW2 in the wide fin region WS.

The gate structure 160 intersects the active region 105 and the channel layers 140, on the active region 105 and the channel layers 140, to extend in the second direction, for example, the Y-direction. Channel regions of transistors may be formed in the active region 105 and the channel layers 140 intersecting the gate structure 160. The gate structure 160 may include a gate electrode 165, a gate dielectric layer 163 between the gate electrode 165 and the channel layers 140, gate spacer layers 164 on side surfaces of the gate electrode 165, and a gate capping layer 166 on the upper surface of the gate electrode 165, as illustrated in FIG. 1B.

The gate dielectric layer 163 may be disposed between the active region 105 and the gate electrode 165 and between the channel layers 140 and the gate electrode 165, and may be disposed to cover at least a portion of the surfaces of the gate electrode 165. For example, the gate dielectric layer 163 may be disposed to surround all surfaces of the gate electrode 165 except the upper surface thereof. The gate dielectric layer 163 may extend between the gate electrode 165 and the gate spacer layers 164, but the configuration is not limited thereto. The gate dielectric layer 163 may include an oxide, nitride, or high-k material. The high-k material may refer to a dielectric material having a higher dielectric constant than that of a silicon oxide layer ($SiO_2$). The high dielectric constant material is, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode 165 may be disposed on the active region 105 to fill a space between the channel layers 140 and to extend upwardly of the channel layers 140. The gate electrode 165 may be symmetrical with respect to a centerline (e.g., a centerline of the gate electrode 165) in the Y-direction. The gate electrode 165 may be spaced apart from the channel layers 140 by the gate dielectric layer 163. The gate electrode 165 may include a conductive material, for example, a metal nitride such as titanium nitride (TiN), tantalum nitride (TaN) or tungsten nitride (WN), and/or a metallic material such as aluminum (Al), tungsten (W) or molybdenum (Mo), or a semiconductor material such as doped polysilicon. The gate electrode 165 may be formed of two or more multilayer structures.

The gate spacer layers 164 may each cover at least one side surface of a gate electrode 165. The gate spacer layers 164 may be disposed on both side surfaces of the gate electrode 165 and may extend in the Z-direction perpendicular to the upper surface of the substrate 101. In some example embodiments, the gate spacer layers 164 may include a portion having a curved outer surface in such a manner that an upper width of each of the gate spacer layers 164 is less than a lower width. The gate spacer layers 164 may insulate the source/drain regions 150 from the gate electrodes 165. The gate spacer layers 164 may have a multilayer structure according to some example embodiments. The gate spacer layers 164 may be formed of oxide, nitride, or oxynitride, and in detail, a low-k film.

The gate capping layer 166 may be disposed on the gate electrode 165 (e.g., an upper surface of the gate electrode 165). The gate capping layer 166 may be disposed to extend in the second direction, for example, the Y-direction along the upper surface of the gate electrode 165. Side surfaces of the gate capping layer 166 may be surrounded by the gate spacer layers 164. An upper surface of the gate capping layer 166 may be substantially coplanar with upper surfaces of the gate spacer layers 164, but the configuration is not limited thereto. The gate capping layer 166 may be formed of oxide, nitride, and oxynitride, and in detail, may include at least one of SiO, SiN, SiCN, SiOC, SiON, and SiOCN.

The gate structure 160 may include first gate structures 160A extending in the Y-direction while intersecting the first active region 105N, and second gate structures 160B extending in the Y-direction while intersecting the second active region 105W. Accordingly, the semiconductor device 100a may include a first gate structure 160A intersecting the first active region 105N and extending in the Y-direction, and the semiconductor device 100a may include a second gate structure 160B intersecting the second active region 105W and extending in the Y-direction. The first gate structures 160A are spaced apart from each other by a first gate separation distance Gd1 in the X-direction, and the second gate structures 160B are spaced apart from each other by a second gate separation distance Gd2 in the X-direction. The first gate separation distance Gd1 and the second gate separation distance Gd2 may be substantially the same. In this specification, "substantially the same" means the same, or a case where there is a difference in the range of deviations occurring in the manufacturing process, and it can be interpreted as the same meaning even when the expression "substantially" is omitted. As illustrated in FIG. 1C, a length of the gate electrode 165 of the first gate structure 160A between the first channel layers 140N, extending in the Y-direction, may be less than a length of the gate electrode 165 of the second gate structure 160B between the second channel layers 140W, extending in the Y-direction. Each of the first and second gate structures 160A and 160B may have a symmetrical shape and thus may be symmetrical with respect to a centerline of each of the first and second gate structures 160A and 160B in the Y-direction.

The source/drain regions 150 may be disposed on the active region 105 on both sides of the channel layers 140. The source/drain regions 150 may serve as a source region or a drain region of the transistor. The source/drain region 150 may be disposed to cover an upper surface of the active region 105, on a side surface of each of the channel layers 140 and on a lower end of the source/drain region 150. The source/drain region 150 may be disposed by partially recessing an upper portion of the active region 105, but in some example embodiments, the presence or absence of the recess and the depth of the recess may be variously changed. In some example embodiments, the source/drain region 150 may have a mutually-connected merged shape, between the active regions 105 adjacent in the Y-direction, but the shape thereof is not limited thereto.

The source/drain regions 150 may be a semiconductor layer including silicon (Si), and may be formed of an epitaxial layer. The source/drain regions 150 may include impurities of different types and/or concentrations. For example, the source/drain regions 150 may include n-type doped silicon (Si) or p-type doped silicon germanium (SiGe). In some example embodiments, the source/drain regions 150 may include a plurality of regions including different concentrations of elements and/or doping elements.

The source/drain regions 150 may be on the first active region 105N, the second active region 105W, and the connection region 105T, and may be on at least one side of each of the first and second gate structures 160A and 160B and at least one side of the dummy structure 170. The source/drain regions 150 may include a first source/drain region 150T disposed on the connection region 105T in the transition region TS, a second source/drain region 150N disposed on the first active region 105N in the narrow fin region NS, and a third source/drain region 150W disposed on the second active region 105W in the wide fin region WS. The first source/drain region 150T may be disposed between a first side of the first gate structure 160A and a first side of the dummy structure 170, facing each other. The second source/drain region 150N may be disposed on a second side of the first gate structure 160A. The first side and the second side of the first gate structure 160A may oppose each other in the X-direction. The third source/drain region 150W may be disposed between a second side of the dummy structure 170 and a first side of the second gate structure 160B, facing each other. The second source/drain region 150N may be disposed between the first gate structures 160A, and the third source/drain region 150W may be disposed between the second gate structures 160B.

The first source/drain region 150T and the second source/drain region 150N may be disposed on both sides in the X-direction, with respect to the first gate structure 160A therebetween. The first source/drain region 150T and the second source/drain region 150N may form an asymmetric structure. A width W1a of the first source/drain region 150T in the Y-direction at a portion where the first source/drain region 150T contacts the dummy structure 170, which may be a maximum width of the first source/drain region 150T in the Y direction, may be greater than a width W2a of the second source/drain region 150N in the Y-direction at a portion where the second source/drain region 150N contacts the first gate structure 160A and may be greater than a maximum width of the second source/drain region 150N in the Y direction. The first source/drain region 150T may have a first length L1 in the X-direction. The second source/drain region 150N may have a second length L2 in the X-direction. The first length L1 may be less than the second length L2.

The first source/drain region 150T may have an asymmetric shape. For example, the first source/drain region 150T may be asymmetrical with respect to a centerline, and the centerline may be a line extending in the Y direction, between both ends (e.g., opposite ends) of the first source/drain region 150T opposing each other in the X-direction. A width W1a of the first source/drain region 150T in the Y-direction on a portion of the first source/drain region 150T adjacent to the dummy structure 170 may be greater than a width W1b thereof in the Y-direction on a portion thereof adjacent to the first gate structure 160A.

In the absence of the first pattern portion 171, since the width of the connection region 105T is changed in the transition region TS, the source/drain regions 150T and 150N on both sides of the first gate structure 160A may have different sizes, e.g., volume. In this case, the performance of the device is changed due to the stress caused by the size difference between the source/drain regions 150T and 150N. According to some example embodiments, the length of the first source/drain region 150T in the X-direction by the first pattern portion 171 of the dummy structure 170 may be L1 which is less than L2. Accordingly, the volume of the first source/drain region 150T may be similar to or substantially the same as the volume of the second source/drain region 150N. Accordingly, since stress due to a size difference between the source/drain regions 150T and 150N may be reduced or significantly decreased, the semiconductor device 100a having improved electrical characteristics and reliability may be provided.

The dummy structure 170 may be disposed to intersect at least a portion of the connection region 105T and to extend in the Y-direction. The dummy structure 170 may be disposed adjacent to and between the first gate structure 160A and the second gate structure 160B (e.g., the dummy structure 170 may be between the first gate structure 160A and the second gate structure 160B in the X-direction).

The dummy structure 170 may be formed to have a shape different from that of the gate structure 160. As shown in at least FIG. 1A, the dummy structure 170 may be asymmetrical with respect to a centerline, of the dummy structure 170, that extends in the Y-direction. The dummy structure 170 may include a first pattern portion 171 spaced apart from (e.g., isolated from direct contact with) a side surface or the first side of the first gate structure 160A by a first distance d1 in the X-direction, and a second pattern portion 172 spaced apart therefrom by a second distance d2 in the X-direction that is greater (e.g., greater in magnitude) than the first distance d1. The second pattern portion 172 may be disposed on both sides of the first pattern portion 171 in the Y-direction. The first pattern portion 171 may intersect the active region 105, and the second pattern portion 172 may be disposed on the device isolation layer 110. The first pattern portion 171 may be disposed to at least partially overlap the inclined surface TP (e.g., inclined side surface) of the active region 105 (e.g., at least partially overlap the inclined side surface of the connection region in the Z-direction).

One side of the first pattern portion 171 may protrude further in the X-direction toward the first gate structure 160A than one side of the second pattern portion 172.

Restated, the first pattern portion 171 may protrude further in the X-direction toward the first gate structure 160A than the second pattern portion 172. Restated further, the first pattern portion 171 may be closer (e.g., proximate) to the first gate structure 160A in the X-direction than the second pattern portion 172). The first pattern portion 171 and the second pattern portion 172 may have different widths each other in the X-direction. The first pattern portion 171 has a first maximum width MW1 in the X-direction, the second pattern portion 172 has a second maximum width MW2 in the X-direction, and the first maximum width MW1 may be greater (e.g., greater in magnitude) than the second maximum width MW2. The first maximum width MW1 of the first pattern portion 171 in the X-direction may be greater than a maximum width of the first gate structure 160A in the X-direction and a maximum width of the second gate structure 160B in the X-direction (e.g., may be greater than both the maximum width of the first gate structure 160A in the X-direction and the maximum width of the second gate structure 160B in the X-direction). The dummy structure 170 may include a bent portion due to (e.g., based on) a difference in width in the X-direction between the first maximum width MW1 and the second maximum width MW2.

The first side of the dummy structure 170 may include a first surface S1 in contact with the first source/drain region 150T, a second surface S2 bent from the first surface S1 (e.g., extending at an angle in relation to the first surface S1), and a third surface S3 bent from the second surface S2 and extending in the Y-direction. The first surface S1 may be a side surface on which the first pattern portion 171 faces the first side of the first gate structure 160A, and the third surface S3 may be a side surface on which the second pattern portion 172 faces the first side of the first gate structure 160A. The first gate structure 160A may include a first portion overlapping the first pattern portion 171 in the X-direction, and a second portion overlapping the second pattern portion 172 in the X-direction. A side surface of the first portion and a side surface of the second portion may be aligned on the first side of the first gate structure 160A. For example, the side surface of the first portion and the side surface of the second portion may extend in parallel with each other and with the first side of the first gate structure 160A. For example, the side surface of the first portion and the side surface of the second portion may be positioned on a straight line in the Y-direction or may extend in a straight line in the Y-direction. The first distance d1 in the X-direction between the first surface S1 and the side surface of the first portion of the first gate structure 160A (which may be part of the first side of the first gate structure 160A) may be less than the second distance d2 in the X-direction between the third surface S3 and the side surface of the second portion of the first gate structure 160A (which may be part of the first side of the first gate structure 160A). The second side of the dummy structure 170 and the second gate structure 160B may be spaced apart from each other by a third distance d3 in the X-direction. In some example embodiments, the third distance d3 may be substantially equal to the second distance d2 and may be greater than the first distance d1. The second distance d2, the third distance d3, the first gate separation distance Gd1, and the second gate separation distance Gd2 may all be substantially the same.

In some example embodiments, the dummy structure 170 may be formed to have various shapes in a plan view. Other adjacent structures may be formed to have the same shape at a constant pitch, and the dummy structure 170 may be formed to have a shape different therefrom.

Figure 5:
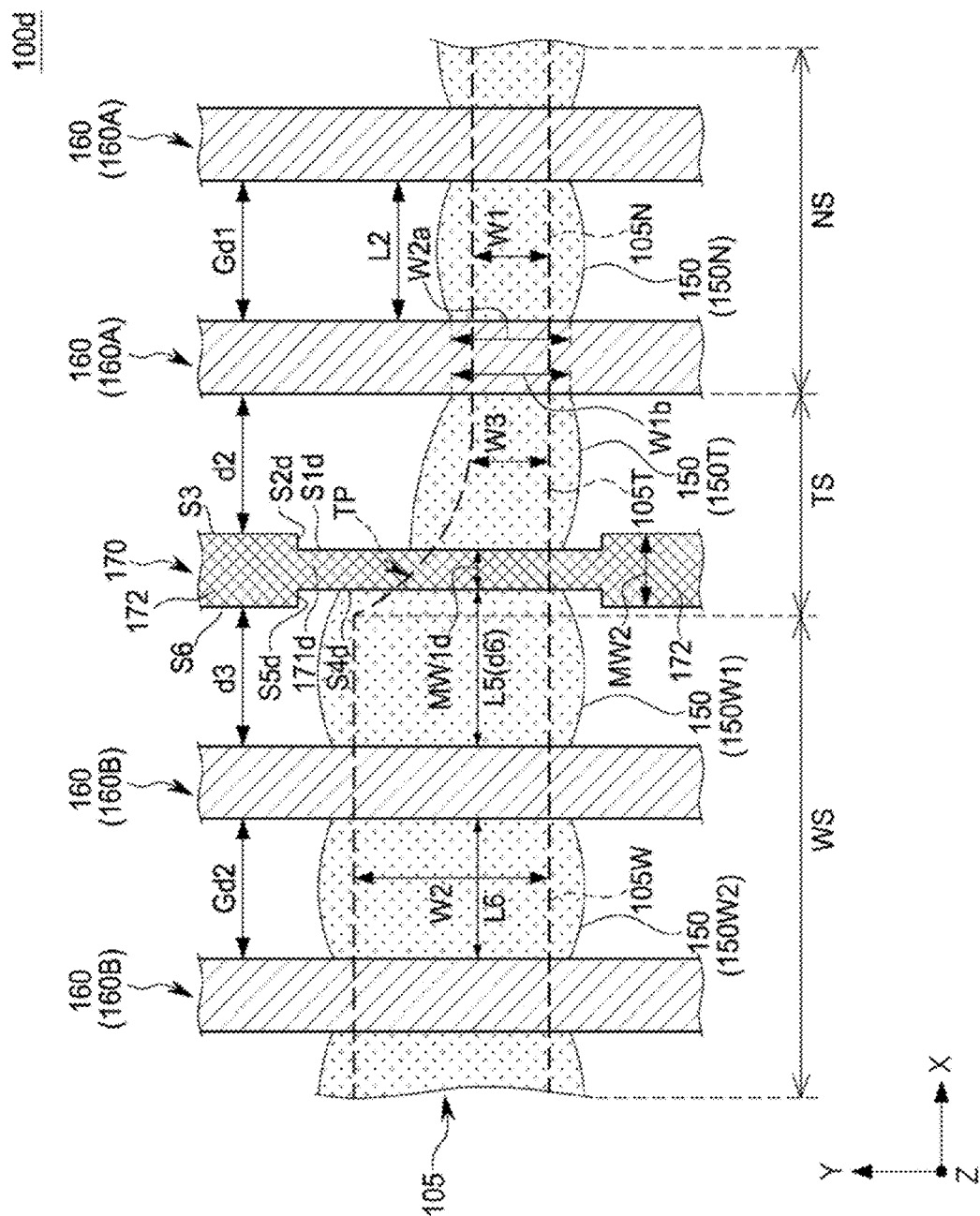
FIGS. 5, 6, 7, 8, and 9 are cross-sectional views illustrating semiconductor devices according to some example embodiments.

As illustrated in FIG. 1B, the dummy structure 170 may include an insulating isolation pattern 178 and a spacer pattern 174 covering at least one side of the insulating isolation pattern 178. Alternatively, the dummy structure 170 may be formed of other components as illustrated in FIG. 5 below. FIGS. 1A to 1C illustrate an example in which the insulating isolation pattern 178 of the dummy structure 170 penetrates through at least a portion of the active region 105 and separates adjacent source/drain regions 150T and 150W. Transistors may be separated to the left and right of the insulating isolation pattern 178. The spacer pattern 174 may be bent to form the first to third surfaces S1, S2, and S3 of the dummy structure 170. The insulating isolation pattern 178 may have an inclined side surface in which a lower width is narrower than an upper width. As shown in at least FIG. 1B, the lower end of the insulating isolation pattern 178 may be located on a level lower than the upper end of the active region 105 and thus may be at a lower level than an upper end of each of the first and second active regions 105N and 105W and the connection region 105T. As shown in at least FIG. 1B, the lower end of the insulating isolation pattern 178 may be positioned on (e.g., may be at) a lower level than lower ends of the source/drain regions 150. The lower end of the insulating isolation pattern 178 may be located on (e.g., may be at) a different level from (e.g., a different level than) a level of the lower end of the device isolation layer 110. The insulating isolation pattern 178 may include at least one of, for example, SiO, SiN, SiCN, SiOC, SiON and SiOCN. The spacer pattern 174 may be formed of the same material as the gate spacer layers 164.

As described herein, a "level" of an element may refer to a distance in the Z-direction of the element from the substrate 101. For example, elements at different levels are at different distances from the substrate 101 in the Z-direction, an element at a higher or lower level than another element may be further or closer to the substrate 101 in the Z-direction than the other element, etc.

The inner spacer layers 130 may be disposed in parallel with the gate electrode 165, between the channel layers 140. The inner spacer layers 130 may respectively have an outer surface that is substantially coplanar with an outer surface of each of the channel layers 140. Below the channel layers 140, the gate electrode 165 may be spaced apart from the source/drain regions 150 by the inner spacer layers 130. The inner spacer layers 130 may have a shape in which a side surface facing the gate electrode 165 is convexly rounded inwardly toward the gate electrode 165, but the shape thereof is not limited thereto. The inner spacer layers 130 may be formed of oxide, nitride, and oxynitride, but in detail, formed of a low-k film. According to some example embodiments, the inner spacer layers 130 may be omitted, and in this case, the source/drain regions 150 may be in direct contact with the side surface of the gate dielectric layer 163, between the channel layers 140.

The contact structure 180 may penetrate through the interlayer insulating layer 190 in a vertical direction, for example, in the Z-direction, between the gate structures 160 and between the gate structures 160 and the dummy structure 170. The contact structure 180 may be connected to the source/drain regions 150. The contact structure 180 may apply an electrical signal to the source/drain regions 150. The contact structure 180 may be disposed on the source/drain regions 150. The contact structure 180 may have an inclined side surface in which a lower width is narrower than an upper width according to an aspect ratio, but the configuration is not limited thereto. The contact structure 180 may include a metal-semiconductor compound layer 181 and a contact plug 185 on the metal-semiconductor compound layer 181.

The metal-semiconductor compound layer 181 may include, for example, metal silicide, metal germanide, or metal silicide-germanide. In the metal-semiconductor compound layer 181, the metal may be titanium (Ti), nickel (Ni), tantalum (Ta), cobalt (Co), or tungsten (W), and the semiconductor may be silicon (Si), germanium (Ge), or silicon germanium (SiGe). For example, the metal-semiconductor compound layer 181 may include at least one of cobalt silicide (CoSi), titanium silicide (TiSi), nickel silicide (NiSi), and tungsten silicide (WSi).

The contact plug 185 may include a barrier layer 185A and a plug layer 185B. The barrier layer 185A may surround a lower surface and side surfaces of the plug layer 185B. The barrier layer 185A may include a metal nitride, for example, at least one of titanium nitride (TiN), tantalum nitride (TaN), and tungsten nitride (WN). The plug layer 185B may include a metal material, for example, at least one of aluminum (Al), copper (Cu), tungsten (W), cobalt (Co), ruthenium (Ru), or molybdenum (Mo). In some example embodiments, the barrier layer 185A may be omitted.

The interlayer insulating layer 190 may be disposed to cover upper surfaces of the source/drain regions 150 and the gate structures 160. The interlayer insulating layer 190 may be disposed to cover a upper surface of a partial region of the device isolation layer 110, which is not covered by the gate structure 160. The interlayer insulating layer 190 may include, for example, at least one of an oxide, a nitride, and an oxynitride, and may include a low-k material.

Figure 2:
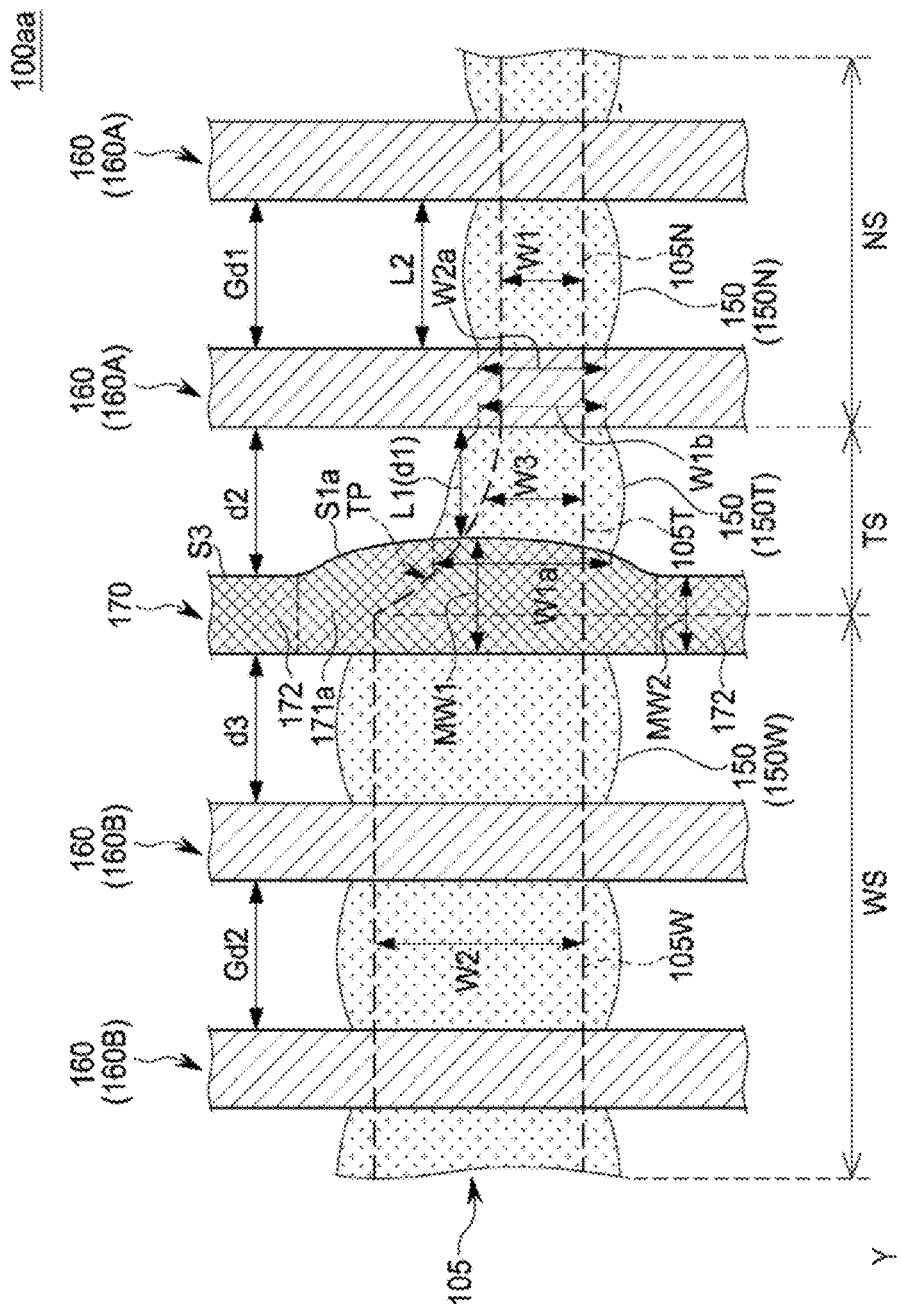
FIG. 2 is a plan view illustrating a semiconductor device according to some example embodiments.

FIG. 2 is a plan view illustrating a semiconductor device according to some example embodiments.

Referring to FIG. 2, in a semiconductor device 100aa, a first pattern portion 171a of the dummy structure 170 may have a convex side surface toward the first gate structure 160A. For example, a first surface S1a that is a side surface of the first pattern portion 171a may convexly protrude from a third surface S3 that is a side surface of a second pattern portion 172. The central portion of the first pattern portion 171a may have a first maximum width MW1 greater than a second maximum width MW2 of the second pattern portion 172 in the X-direction. The width of an edge portion of the first pattern portion 171a in the X-direction may gradually decrease from the central portion toward the second pattern portion 172. The edge portion may be disposed on both sides of the central portion in the Y-direction, and may be connected to the second pattern portion 172. The structure of the cross section of the semiconductor device 100aa may be the same as or similar to that of FIGS. 1B and 1C.

Figure 3A:
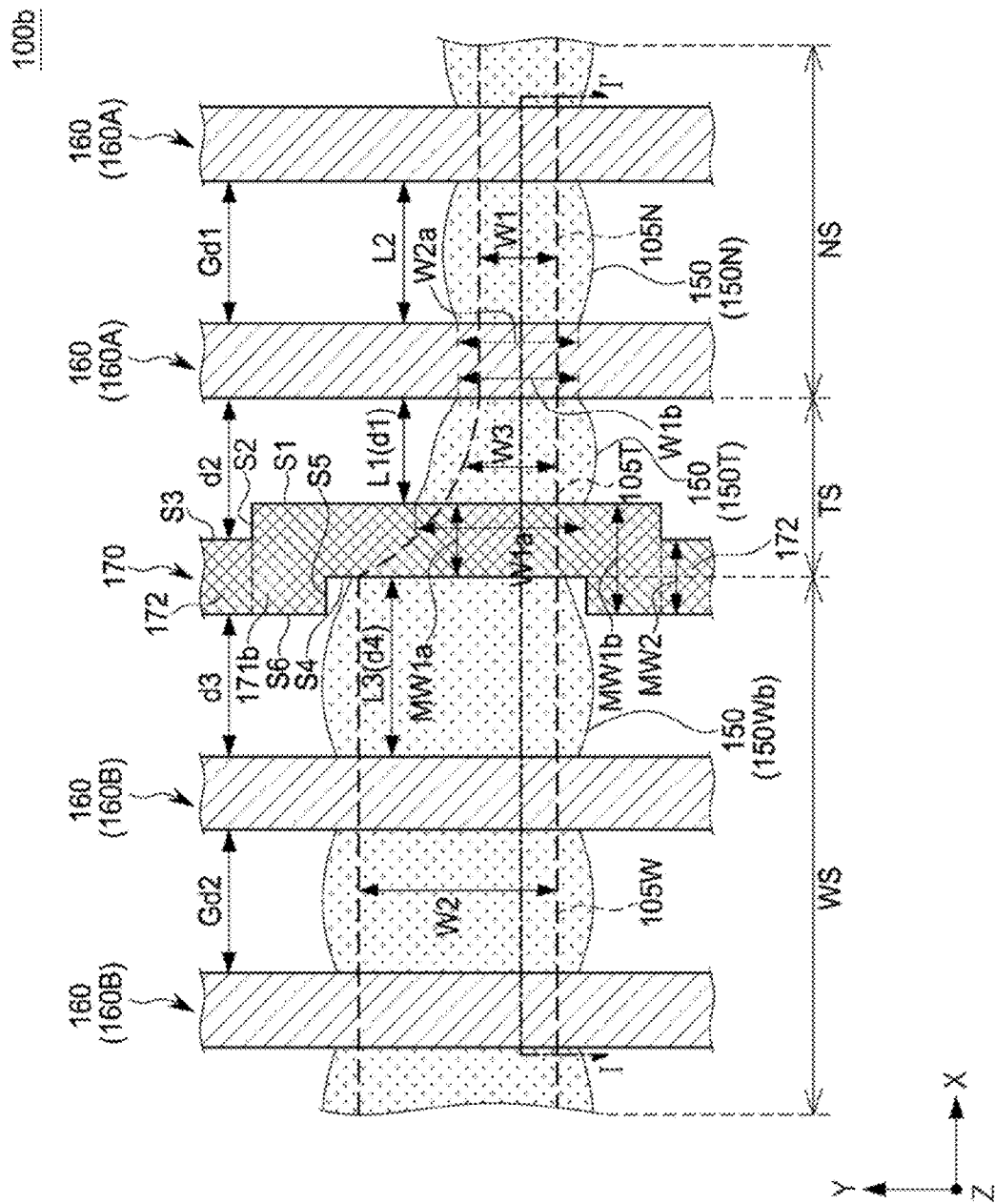
FIGS. 3A and 3B are plan views illustrating semiconductor devices according to some example embodiments.
Figure 3B:
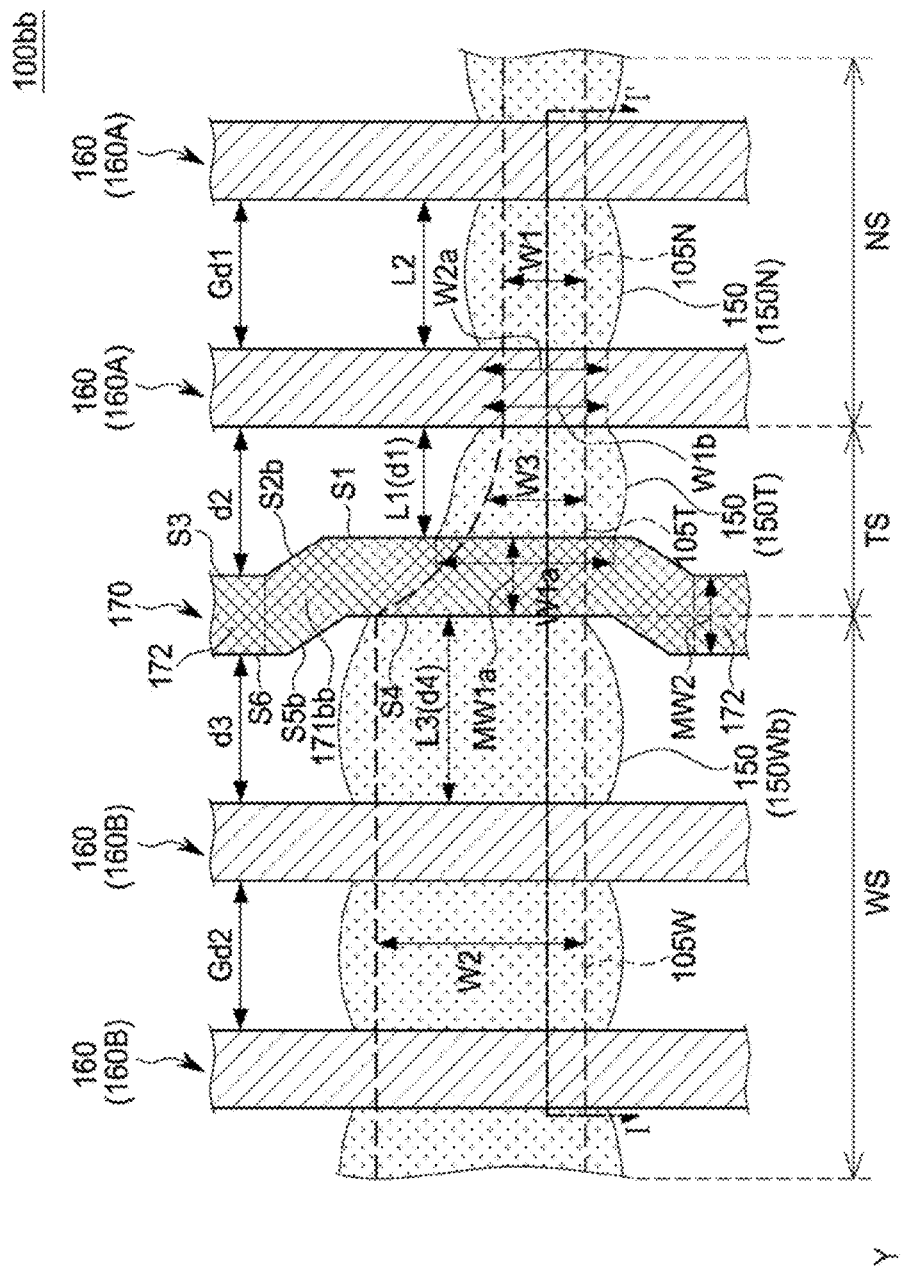

FIGS. 3A and 3B are plan views illustrating semiconductor devices according to some example embodiments.

Figure 3C:
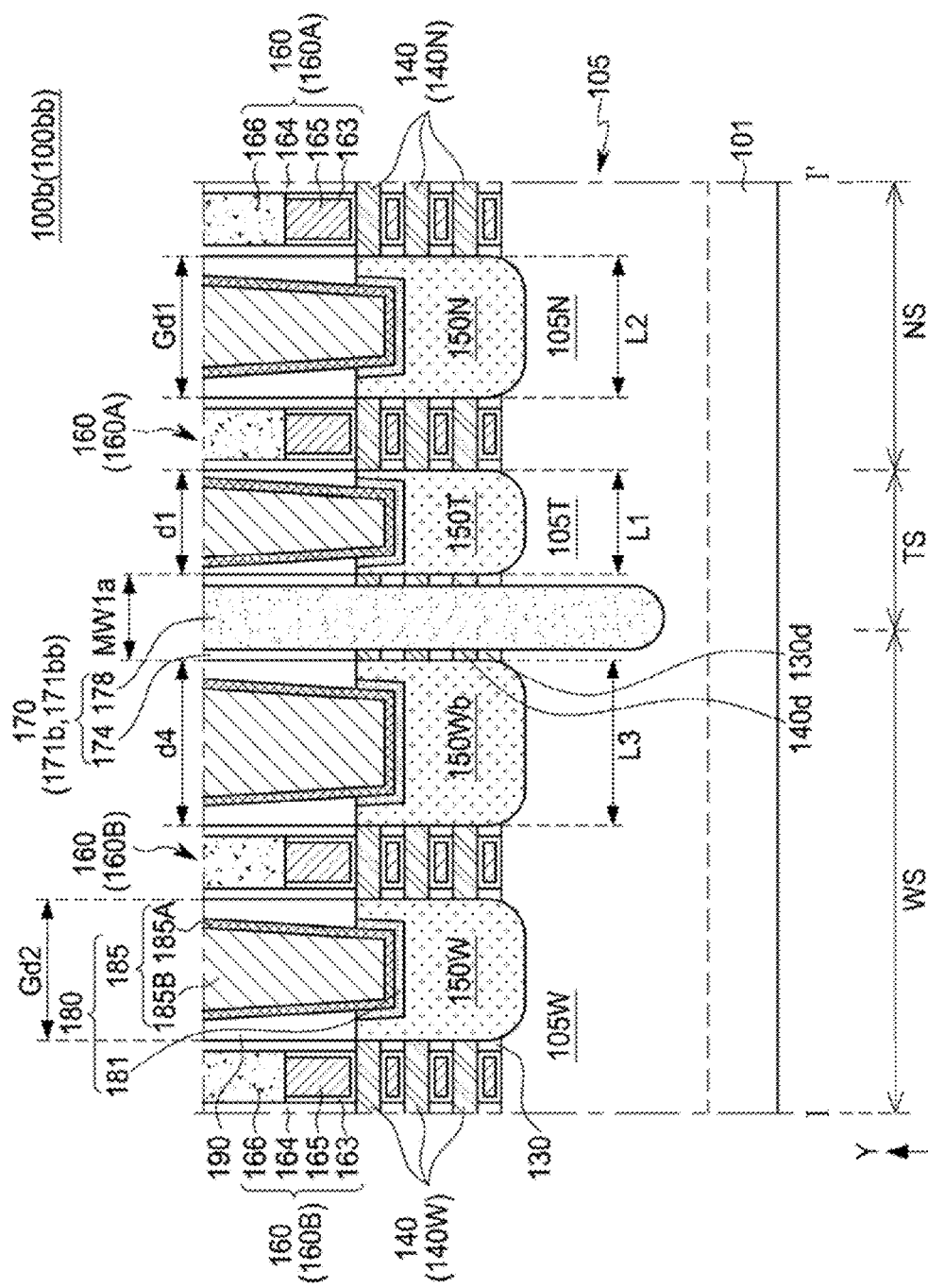
FIG. 3C is a cross-sectional view illustrating a semiconductor device according to some example embodiments.

FIG. 3C is a cross-sectional view illustrating a semiconductor device according to some example embodiments. FIG. 3C may correspond to a cross-section of the semiconductor device of FIG. 3A taken along line I-I' shown in FIG. 3A or may correspond to a cross section of the semiconductor device of FIG. 3B taken along line I-I' shown in FIG. 3B.

Referring to FIGS. 3A and 3C, in a semiconductor device 100b, a first pattern portion 171b of a dummy structure 170 may include a protrusion and a recess. The protrusion may protrude from one side S3 of a second pattern portion 172 toward a first gate structure 160A. The recess may extend from the other side of the second pattern portion 172 and be concavely recessed toward the first gate structure 160A. The first pattern portion 171b may have a first region having a width MW1a substantially equal to a second maximum width MW2 of the second pattern portion 172, and a second region having a first maximum width MW1b greater than the second maximum width MW2.

A first side of the dummy structure 170 facing the first gate structure 160A may have a structure having the first to third surfaces S1, S2 and S3 described with reference to FIGS. 1A to 1C. A second side of the dummy structure 170 facing the second gate structure 160B may have fourth to sixth surfaces S4, S5, and S6. The fourth surface S4 is opposite to the first surface S1, the fifth surface S5 is bent from the fourth surface S4, and the sixth surface S6 may be bent from the fifth surface S5 and extend in the Y-direction to be connected to the other side surface of the second pattern portion 172. A length of the fourth surface S4 in the Y-direction may be less than a length of the first surface S1 in the Y-direction. The fourth distance d4 in the X-direction between the fourth surface S4 and the second gate structure 160B may be greater than the third distance d3 in the X-direction between the sixth surface S6 and the second gate structure 160B.

Unlike in the case of some example embodiments, for example the example embodiments shown in FIGS. 1A-1C and/or FIG. 2, the third source/drain region 150Wb may have a relatively long length in the X-direction. For example, the third source/drain region 150Wb may have a third length L3 greater than the second length L2 of the second source/drain region 150N in the X-direction. The third length L3 may be greater than the first length L1 of the first source/drain region 150T.

Referring to FIGS. 3B and 3C, in a semiconductor device 100bb, a first pattern portion 171bb of a dummy structure 170 has a structure similar to that of the first pattern portion 171b of FIG. 3A, but may be bent at an obtuse angle from a second pattern portion 172. For example, a second surface S2b may form an obtuse angle with the first surface S1 and the third surface S3, and may be bent from the first surface S1 and the third surface S3. The fifth surface S5b may also form an obtuse angle with the fourth surface S4 and the sixth surface S6, and may be bent from the fourth surface S4 and the sixth surface S6.

Figure 4A:
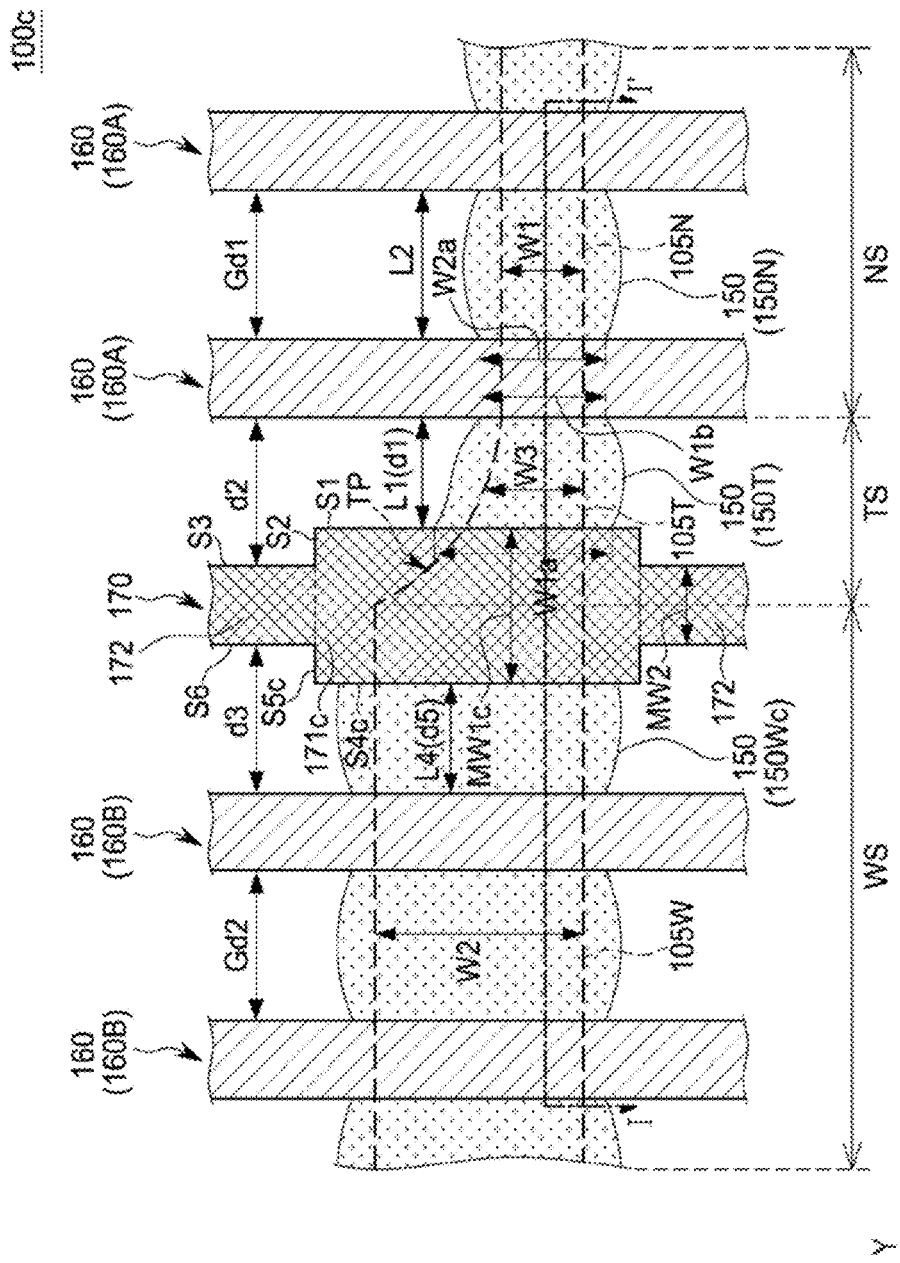
FIGS. 4A and 4B are plan views illustrating semiconductor devices according to some example embodiments.
Figure 4B:
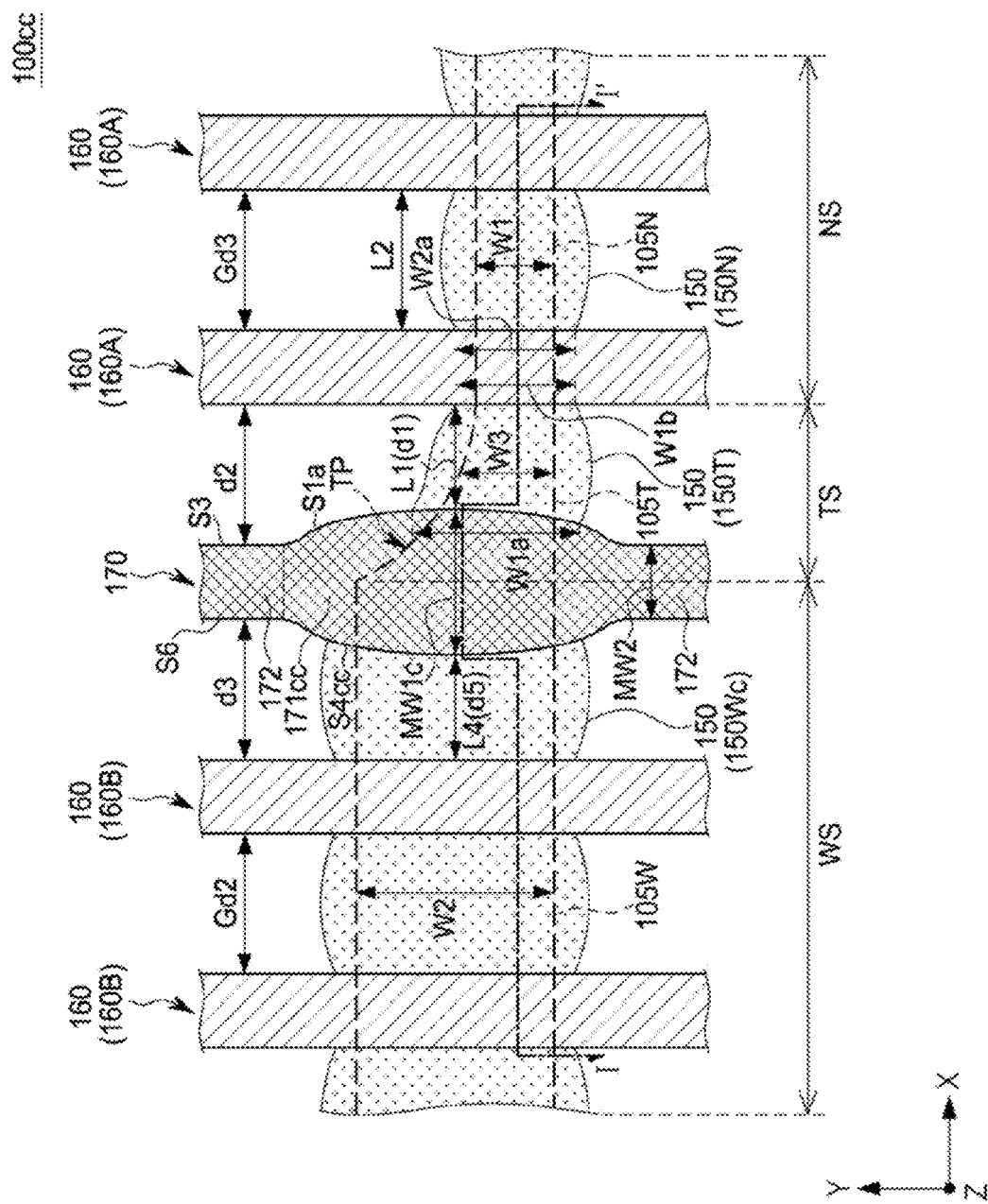

FIGS. 4A and 4B are plan views illustrating semiconductor devices according to some example embodiments.

Figure 4C:
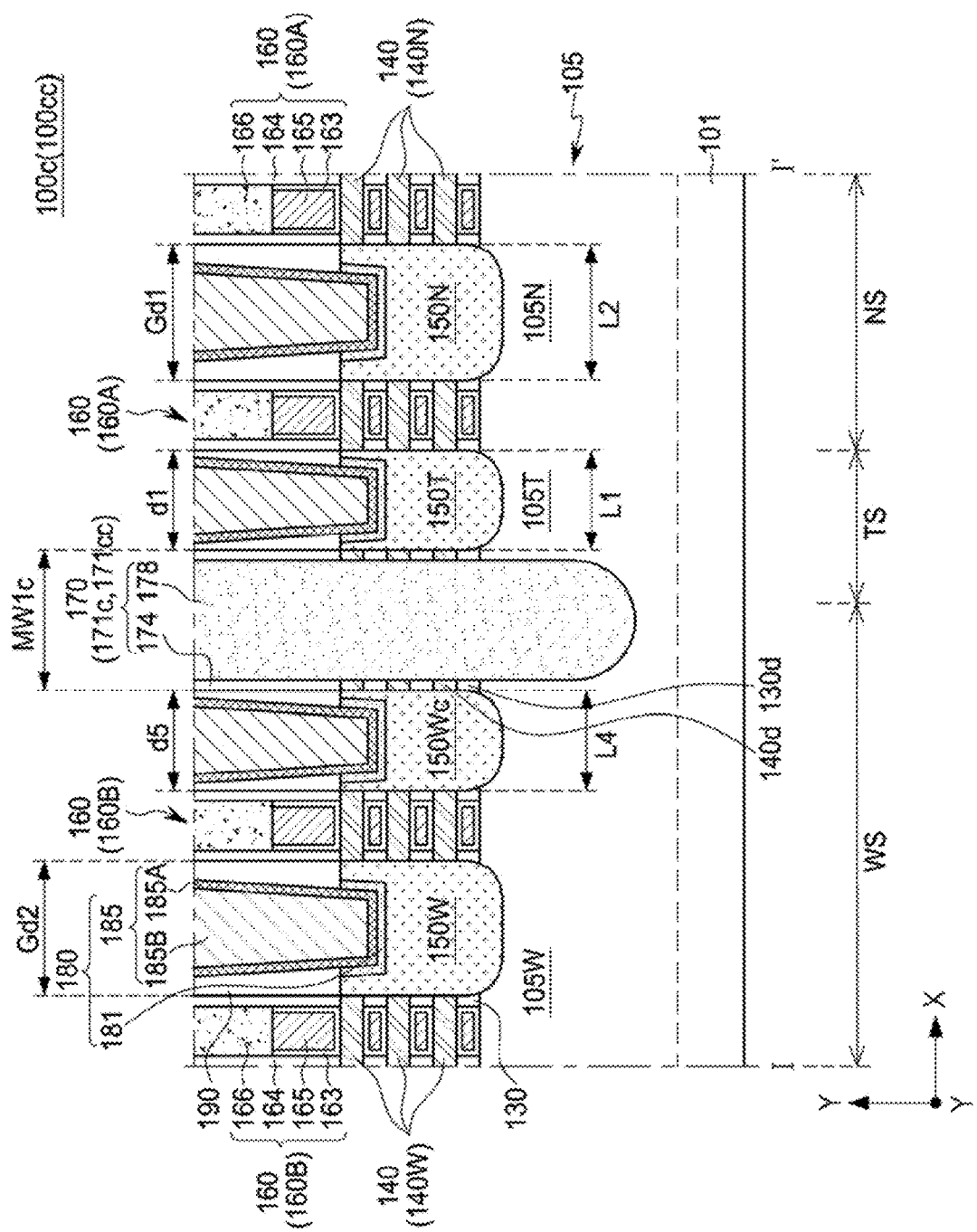
FIG. 4C is a cross-sectional view illustrating a semiconductor device according to some example embodiments.

FIG. 4C is a cross-sectional view illustrating a semiconductor device according to some example embodiments. FIG. 4C may correspond to a cross-section of a semiconductor device of FIG. 4A, taken along line I-I' shown in FIG. 4A, or may correspond to a cross section of a semiconductor device of FIG. 4B, taken along line I-I' shown in FIG. 4B.

Referring to FIGS. 4A and 4C, in a semiconductor device 100c, both side surfaces of a first pattern portion 171c of a dummy structure 170, opposing each other in the X-direction, may protrude further than both side surfaces of a second pattern portion 172, opposing each other in the X-direction. For example, a first surface S1 of the dummy structure 170 may protrude further toward the first gate structure 160A than a third surface S3, and a fourth surface S4c may protrude further toward the second gate structure 160B than a sixth surface S6. The dummy structure 170 may also be understood to include protrusions that respectively protrude from both sides thereof in the X-direction. A first pattern portion 171c may have a first maximum width MW1c greater than a second maximum width MW2 of the second pattern portion 172.

A first side of the dummy structure 170 facing the first gate structure 160A may have a structure having the first to third surfaces S1, S2, and S3 described with reference to FIGS. 1A to 1C. A second side of the dummy structure 170 facing the second gate structure 160B may have fourth to sixth surfaces S4c, S5c, and S6. Unlike some example embodiments, including the example embodiments shown in FIG. 3A, the fourth surface S4c may protrude from the sixth surface S6 that is another side of the second pattern portion 172 toward the second gate structure 160B, and the fifth surface S5c may be bent from the fourth surface S4c. A fifth distance d5 in the X-direction between the fourth surface S4c and the second gate structure 160B may be less than a third distance d3 in the X-direction between the sixth surface S6 and the second gate structure 160B.

Unlike in the case of some example embodiments, for example the example embodiments shown in FIGS. 1A-1C, FIG. 2, and/or FIGS. 3A-3C, the third source/drain region 150Wc may have a relatively short length in the X-direction. For example, the third source/drain region 150Wc may have a fourth length L4 less than the second length L2 of the second source/drain region 150N in the X-direction. The fourth length L4 may be substantially the same as the first length L1 of the first source/drain region 150T, but is not limited thereto.

Referring to FIGS. 4B and 4C, in a semiconductor device 100cc, both side surfaces of a first pattern portion 171cc opposing each other in the X-direction may be convex toward the first gate structure 160A and the second gate structure 160B, respectively. For example, a first surface S1 and a fourth surface S4cc of the first pattern portion 171cc may protrude further convexly than a third surface S3 and a sixth surface S6 which are side surfaces of a second pattern portion 172. A central portion of the first pattern portion 171cc may have a first maximum width MW1c greater than a second maximum width MW2 of the second pattern portion 172 in the X-direction. A width of an edge portion of the first pattern portion 171cc in the X-direction may gradually decrease from the central portion toward the second pattern portion 172. The edge portion may be disposed on both sides of the central portion in the Y-direction, and may be connected to the second pattern portion 172.

FIG. 5 is a plan view illustrating a semiconductor device according to some example embodiments.

Referring to FIG. 5, in a semiconductor device 100d, a first pattern portion 171d of a dummy structure 170 may have a first maximum width MW1d less than a second maximum width MW2 of a second pattern portion 172. The dummy structure 170 may have a dumbbell shape in which the width of the center portion is less than the width of the edge portion in plan view. A first side of the dummy structure 170 facing a first gate structure 160A may have first to third surfaces S1d, S2d, and S3, and a second side of the dummy structure 170 facing a second gate structure 160B may have fourth to sixth surfaces S4d, S5d, and S6. Unlike in the case of some example embodiments, for example the example embodiments shown in FIGS. 1A-1C, FIG. 2, FIGS. 3A-3C and/or FIG. 4, the first surface S1d may be depressed further than the third surface S3 in a direction away from the first gate structure 160A, and the fourth surface S4d may be depressed further than the sixth surface S6 in a direction away from the second gate structure 160B. The first surface S1d and the third surface S3 may be connected while having a curve, and the fourth surface S4d and the sixth surface S6 may be connected while having a curve. A sixth distance d6 between the fourth surface S4d and the second gate structure 160B may be greater than a third distance d3 between the sixth surface S6 and the second gate structure 160B.

In some example embodiments, a portion of the dummy structure 170, for example, the shape of the first pattern portion 171d, may be modified to reduce or significantly reduce a volume difference between third and fourth source/drain regions 150W1 and 150W2 disposed on both sides of the second gate structure 160B. For example, as a length L5 of the third source/drain region 150W1 in the X-direction is formed to be greater than a length L6 of the fourth source/drain region 150W2 in the X-direction, a volume of the third source/drain region 150W1 may be similar to or substantially the same as that of the fourth source/drain region 150W2.

Figure 6:
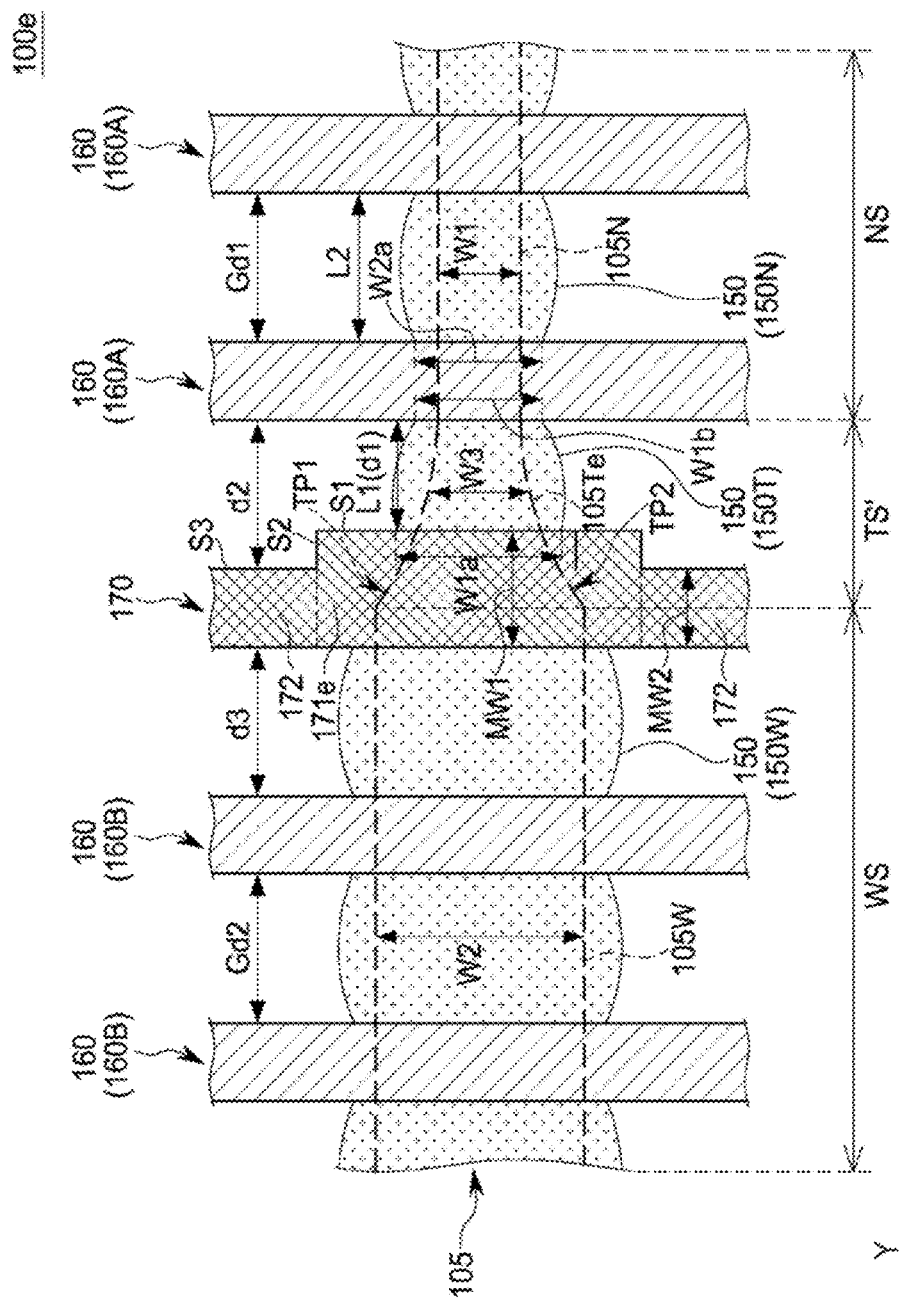

FIG. 6 is a plan view illustrating a semiconductor device according to some example embodiments.

Referring to FIG. 6, in a semiconductor device 100e, a connection region 105Te of an active region 105 may provide (e.g., may include and/or may at least partially define) tapered or inclined side surfaces TP1 and TP2 by a portion thereof in which a width in the Y-direction changes in a transition region TS'. For example, the connection region 105Te may have the first inclined surface TP1 connected from one side of a first active region 105N to one side of a second active region 105W, and the second inclined surface TP2 connected from the other side of the first active region 105N to the other side of the second active region 105W. The dummy structure 170 may have the same shape as in FIG. 1A and may have a first pattern portion 171e and a second pattern portion 172, and each of the source/drain regions 150 may have a symmetrical shape with respect to a centerline in the X-direction. The structure of the active region 105 of FIG. 5 may be equally applied to other embodiments of the present specification.

Figure 7:
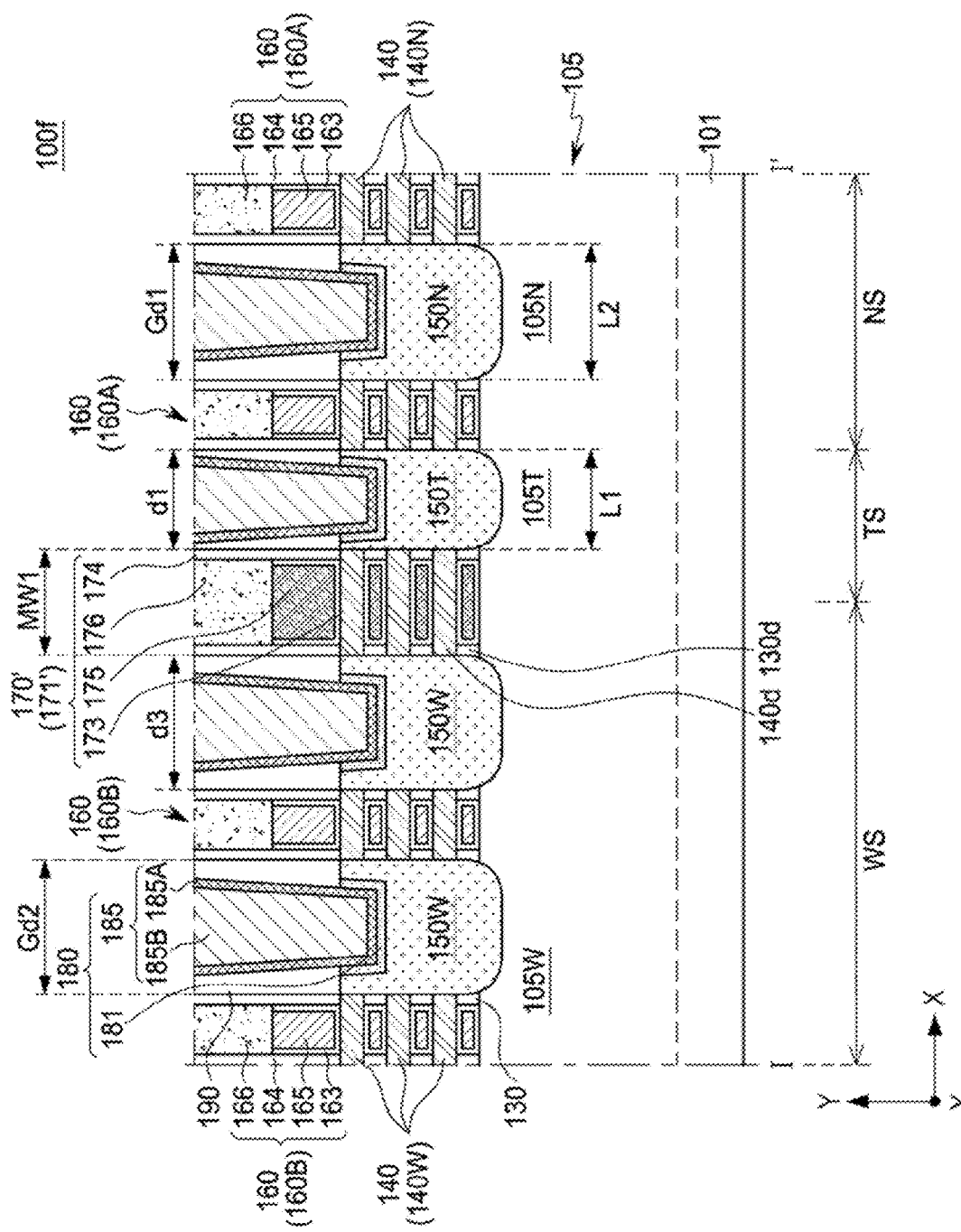

FIG. 7 is a cross-sectional view illustrating a semiconductor device according to some example embodiments. FIG. 7 illustrates a region corresponding to a cross section taken along line I-I' in FIG. 1A.

Referring to FIG. 7, in a semiconductor device 100f, a dummy structure 170' may include a dummy gate dielectric layer 173, a dummy gate electrode 175, a dummy gate capping layer 176, and a spacer pattern 174. The components of the dummy structure 170' may be seen from the cut surface of a first pattern portion 171'. Although not illustrated, the components may also be visible in a second pattern portion 172. The dummy structure 170' may have a structure similar to that of the gate structure 160, and the dummy gate electrode 175 and the dummy gate dielectric layer 173 may be disposed to surround at least a portion of a dummy channel layer 140d. For example, the spacer pattern 174 may cover at least one side surface of the dummy gate electrode 175, and the dummy gate capping layer 176 may cover an upper surface of the dummy gate electrode 175. Since the spacer pattern 174 forms an outer sidewall of the dummy structure 170' and is conformally disposed, the dummy gate electrode 175 may have a shape in which at least one region is bent in a plane. Restated, at least a portion of the dummy gate electrode may include a bent portion. The dummy gate electrode 175 may include the same conductive material as a gate electrode 165.

The dummy gate electrode 175 of the dummy structure 170' may not perform a practical function in the semiconductor device. The dummy structure 170' may electrically isolate the source/drain regions 150T and 150W. Transistors of the dummy structure 170' may be electrically separated thereby to the left and right thereof. The dummy gate electrode 175 may be in a floating state. A specific voltage different from the voltage applied to the gate electrode 165 may be applied to the dummy gate electrode 175. The dummy structures of the previous embodiments having various pattern shapes in a plane may be formed of the same components as those of the dummy structure 170' of FIG. 7.

Figure 8:
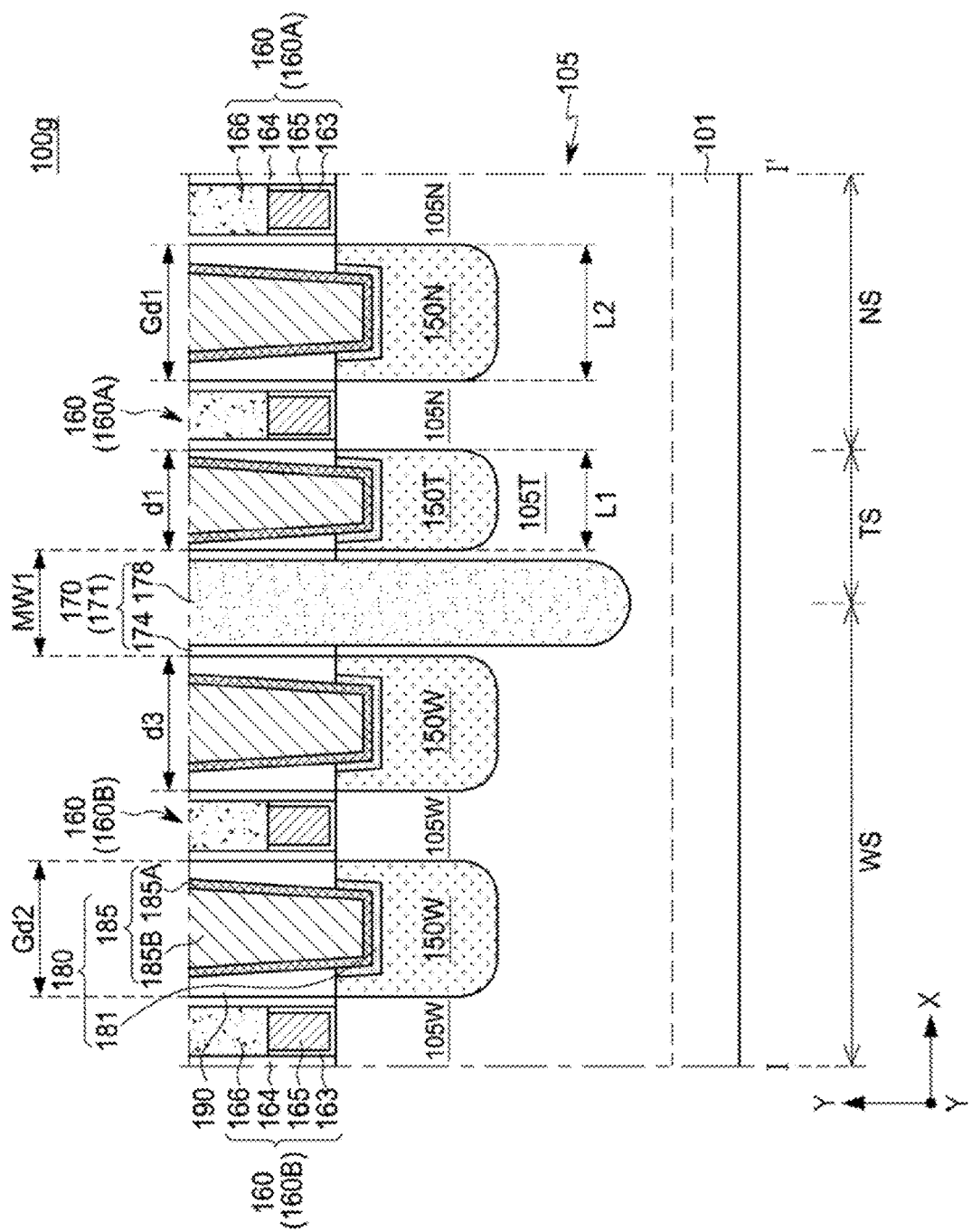

FIG. 8 is a cross-sectional view illustrating a semiconductor device according to some example embodiments. FIG. 8 illustrates a region corresponding to a cross section taken along line I-I' of FIG. 1A.

Referring to FIG. 8, in a semiconductor device 100g, a gate electrode 165 of a gate structure 160 may include a FinFET surrounding three surfaces of an active region 105, for example, an upper surface of the active region 105 and side surfaces thereof in the Y-direction. Unlike in some example embodiments, including the example embodiments shown in FIGS. 1A to 1C, the semiconductor device 100g may not include a plurality of channel layers, and may have a structure in which a channel region of the transistor is formed in the active region 105 intersecting the gate electrode 165. A connection region 105T of the active region 105 provides an inclined surface TP, and the pattern of the dummy structure 170 and the structure of a first source/drain region 150T and a second source/drain region 150N may be the same as the description of FIGS. 1A to 1C.

Figure 9:
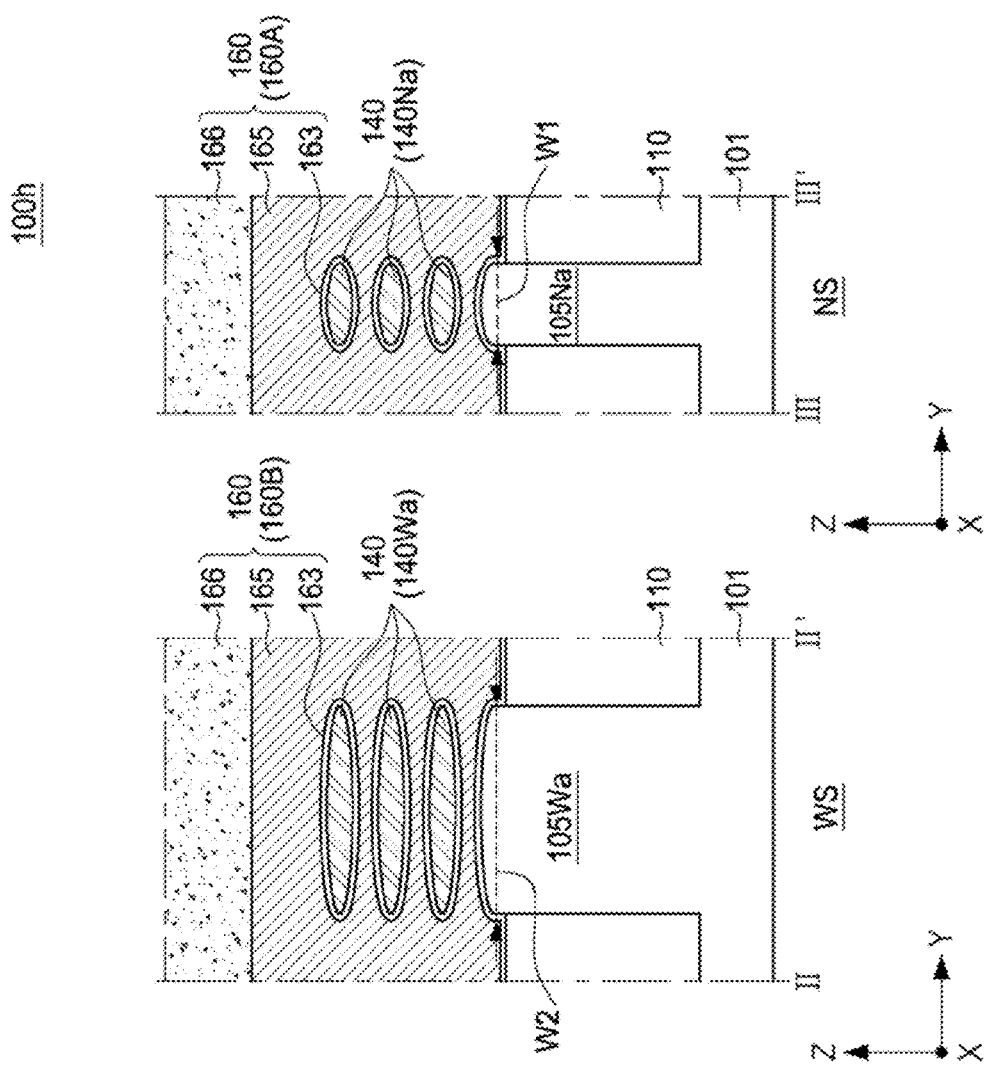

FIG. 9 is a cross-sectional view illustrating a semiconductor device according to some example embodiments. FIG. 9 illustrates regions corresponding to cross-sections taken along lines II-II' and in FIG. 1A.

Referring to FIG. 9, in a semiconductor device 100h, respective shapes of the first active region 105Na and the first channel layers 140Na, and the second active region 105Wa and the second channel layers 140Wa, may be different from that illustrated in some example embodiments, including the example embodiments shown in FIG. 1C. Each of the first channel layers 140Na and the second channel layers 140Wa may have an elliptical shape in a cross-section in the Y-direction. A width of the elliptical shape of the first channel layers 140Na in the Y-direction may be less than a width of the elliptical shape of the second channel layers 140Wa in the Y-direction. In some example embodiments, the width of each of the first active region 105Na and the first channel layers 140Na, and the second active region 105Wa and the second channel layers 140Wa, and the shape thereof accordingly, may be variously changed.

FIGS. 10A, 10B, 10C, 11A, 11B, 11C, 12, 13, 14A, 14B, and 15 are diagrams illustrating a process sequence to describe a method of manufacturing a semiconductor device according to some example embodiments. Some example embodiments of a method of manufacturing the semiconductor device of FIGS. 1 to 1C will be described with reference to FIGS. 10A to 13.

Figure 10A:
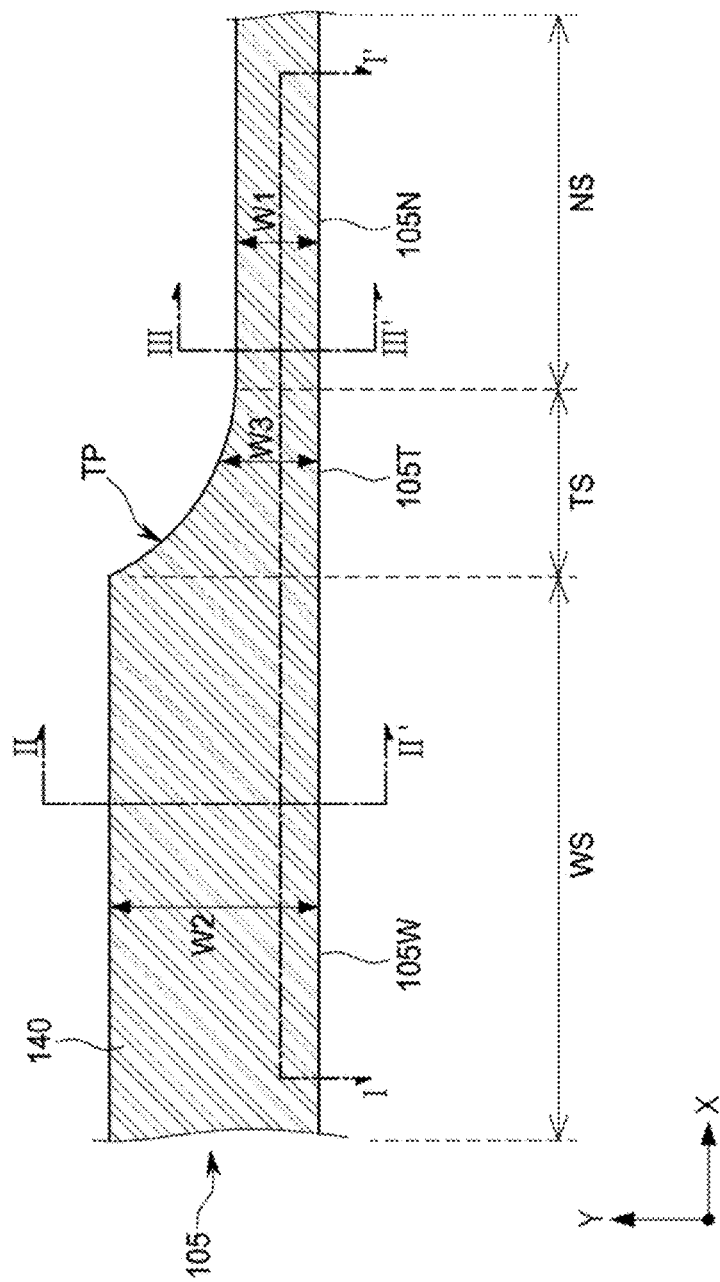
FIGS. 10A, 10B, 10C, 11A, 11B, 11C, 12, 13, 14A, 14B, and 15 are diagrams illustrating a process sequence to illustrate a method of manufacturing a semiconductor device according to some example embodiments.
Figure 10B:
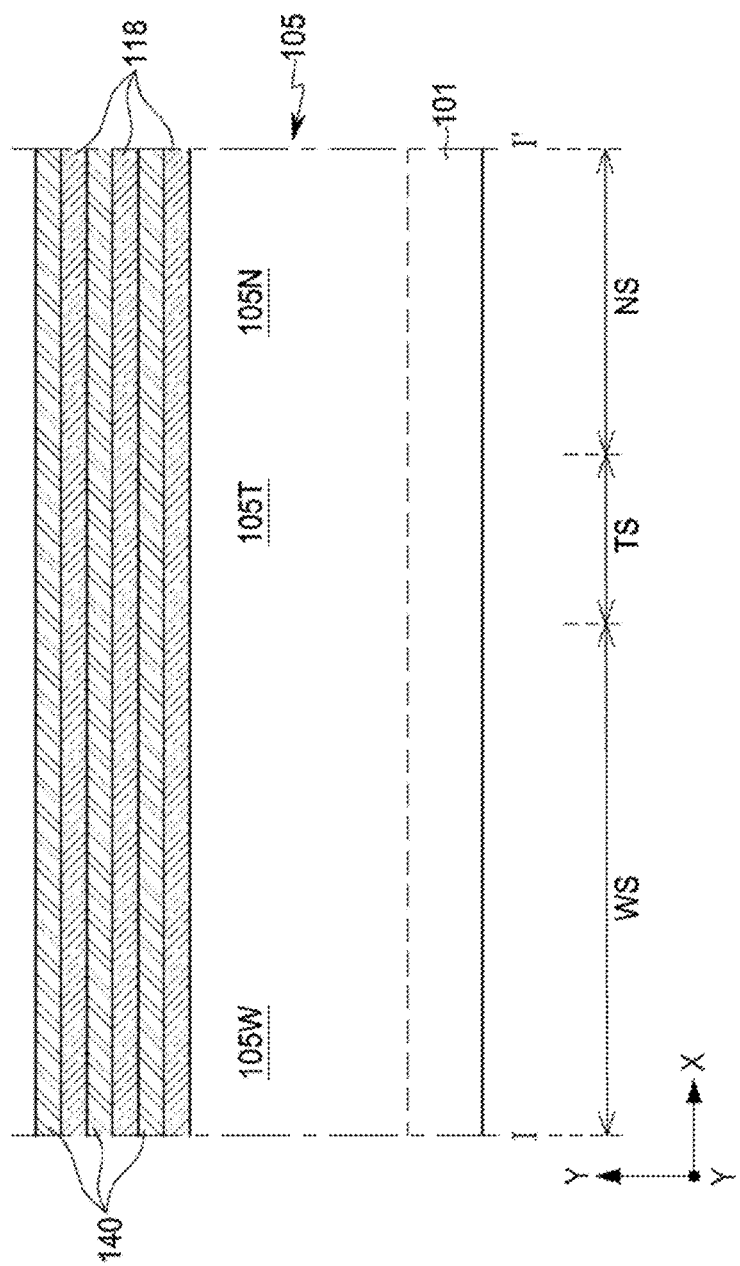
Figure 10C:
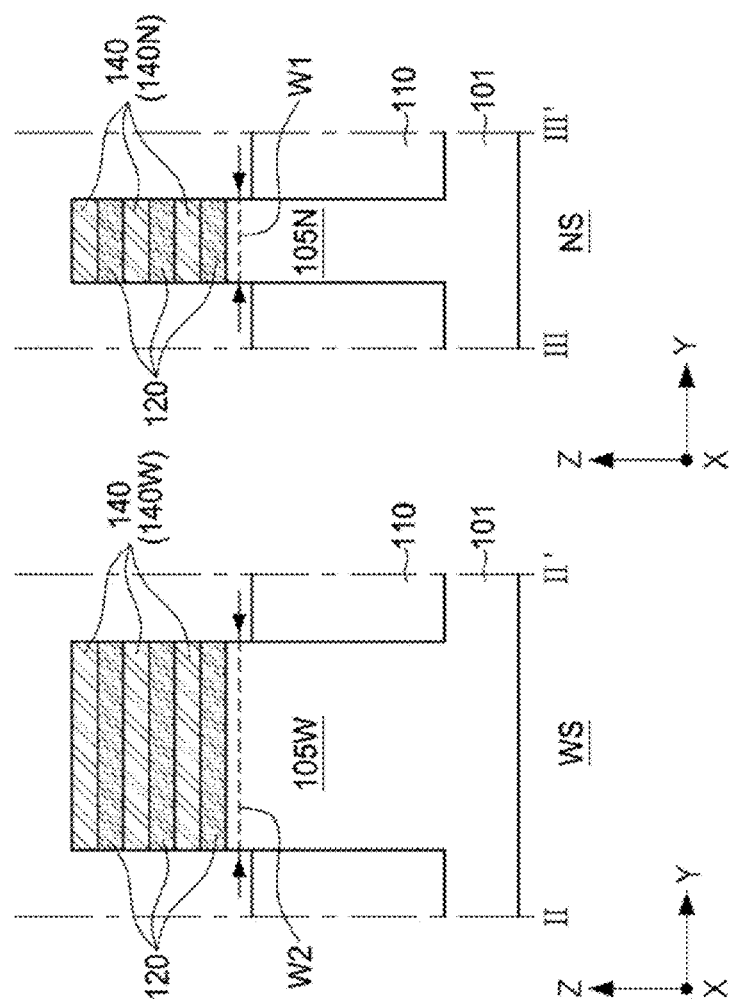

FIG. 10A is a plan view illustrating a semiconductor device according to some example embodiments. FIGS. 10B and 10C are cross-sectional views illustrating a semiconductor device according to some example embodiments. FIG. 10B illustrates a cross-section of the semiconductor device of FIG. 10A taken along line I-I' shown in FIG. 10A. FIG. 10C illustrates cross-sections of the semiconductor device of FIG. 10A taken along lines II-II' and III-III' shown in FIG. 10A.

Referring to FIGS. 10A to 10C, sacrificial layers 118 and channel layers 140 may be alternately stacked on a substrate 101. Next, portions of a stacked structure of the sacrificial layers 118 and the channel layers 140 and the substrate 101 may be removed to form an active structure.

The sacrificial layers 118 may be replaced by a gate dielectric layer 163 and the gate electrode 165 as illustrated in FIG. 1B by a subsequent process. The sacrificial layers 118 may be formed between the substrate 101 and a lower channel layer 140, between the lower channel layer 140 and an intermediate channel layer 140 (e.g., a channel layer 140 that is between a lowermost channel layer 140 and an uppermost channel layer in the Z-direction), and between the intermediate channel layer 140 and an upper channel layer 140 (e.g., uppermost channel layer 140 in the Z-direction). The sacrificial layers 118 may be formed of a material having etch selectivity with respect to the channel layers 140. The channel layers 140 may include a material different from that of the sacrificial layers 118. The sacrificial layers 118 and the channel layers 140 may include a semiconductor material including at least one of, for example, silicon (Si), silicon germanium (SiGe) and germanium (Ge), and may include materials different from each other, and may or may not include impurities. For example, the sacrificial layers 118 may include silicon germanium (SiGe), and the channel layers 140 may include silicon (Si).

The sacrificial layers 118 and the channel layers 140 may be formed by performing an epitaxial growth process by using the substrate 101 as a seed. Each of the sacrificial layers 118 and the channel layers 140 may have a thickness in a range of about 1 Å to 100 nm. The number of layers of the channel layers 140 alternately stacked with the sacrificial layer 118 may be variously changed in some example embodiments.

The active structure may include the sacrificial layers 118 and the channel layers 140 that are alternately stacked on each other, and may further include an active region 105 formed to protrude from the upper surface of the substrate 101 by removing a portion of the substrate 101. The active structure may be formed to have the form of a line extending in one direction, for example, the X-direction. The active structure may be formed to have a plurality of regions having different widths in the Y-direction. For example, in a narrow fin region NS, the active region 105 of the active structure is formed as a first active region 105N having a first width W1, and the sacrificial layers 118 and the first channel layers 140N, thereon, may also be formed to have a width similar to or the same as the first width W1. In a wide fin region WS, the active region 105 of the active structure is formed as a second active region 105W having a second width W2, and the sacrificial layers 118 and the second channel layers 140W, thereon, may also be formed to have a width similar to or the same as that of the second width W2. In a transition region TS, the active region 105 of the active structure is formed as a connection region 105T having a third width W3, and the sacrificial layers 118 and the channel layers 140 thereon may also be formed to have a width similar to or the same as the third width W3. The active structure may be formed to have an inclined side surface TP due to a difference in width in the Y-direction.

A device isolation layer 110 may be formed in a region from which the substrate 101 is partially removed, by filling the region with an insulating material and then recessing the region to enable the active region 105 to protrude. An upper surface of the device isolation layer 110 may be formed to be lower than an upper surface of the active region 105.

Figure 11A:
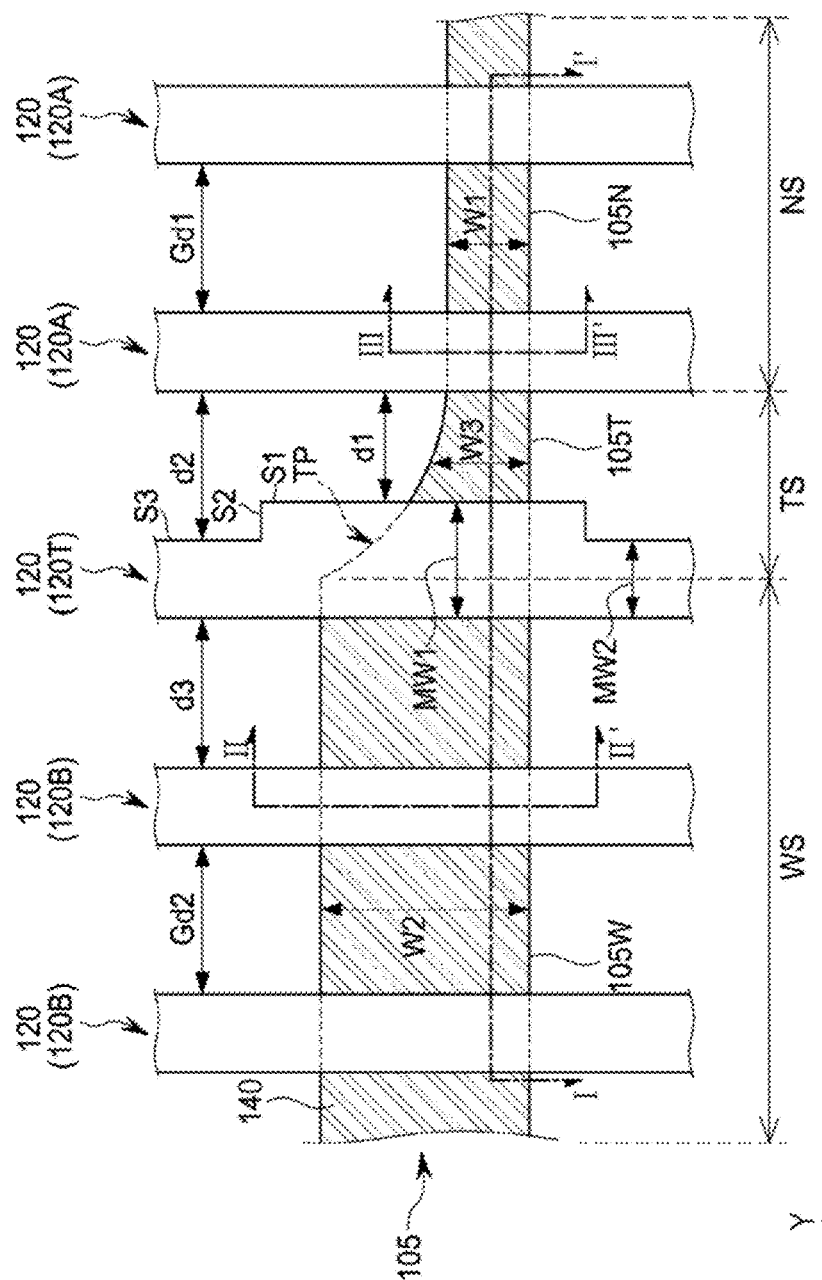
Figure 11B:
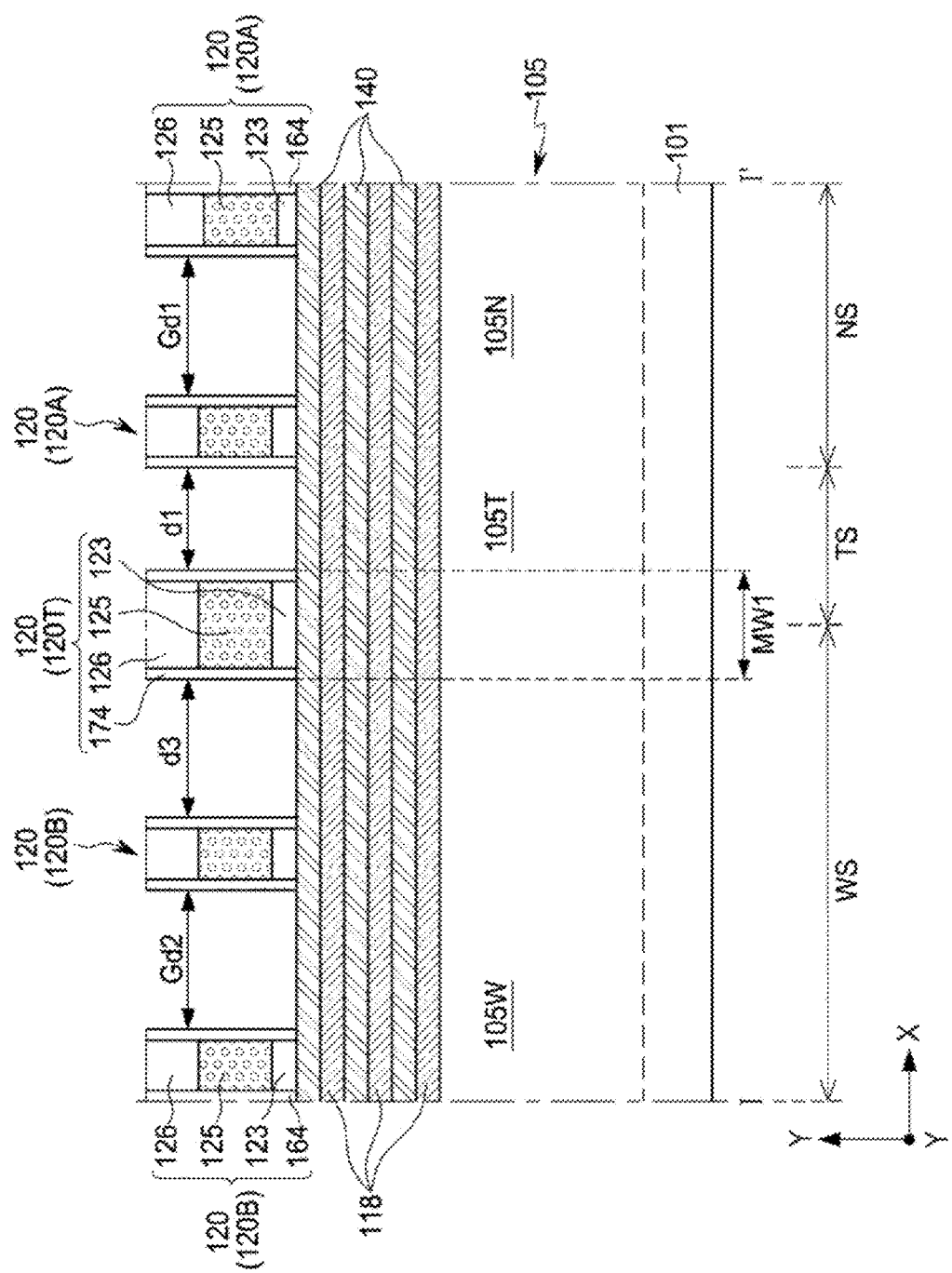

FIG. 11A is a plan view illustrating a semiconductor device according to some example embodiments. FIGS. 11B and 10C are cross-sectional views illustrating a semiconductor device according to some example embodiments. FIG. 11B illustrates a cross-section of the semiconductor device of FIG. 11A taken along line I-I' shown in FIG. 11A. FIG. 10C illustrates cross-sections of the semiconductor device of FIG. 11A taken along lines II-II' and III-III' shown in FIG. 11A.

Figure 11C:
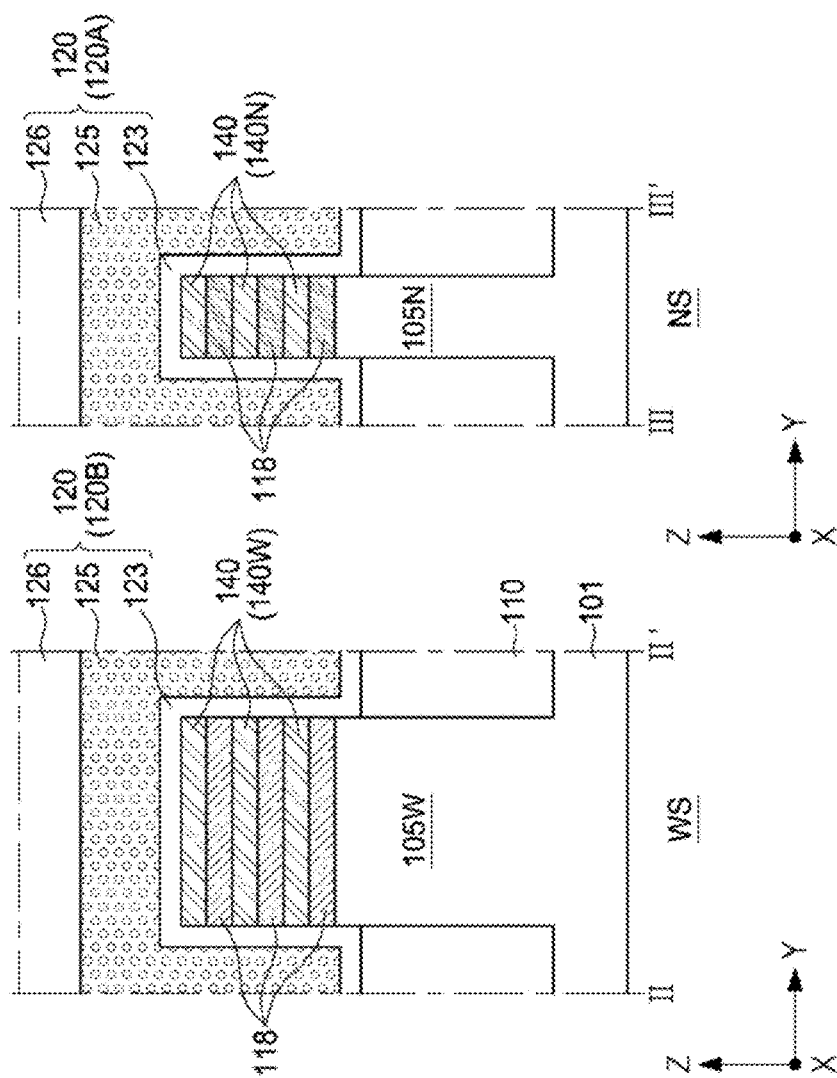

Referring to FIGS. 11A to 11C, sacrificial gate structures 120 may be formed on the active structure.

The sacrificial gate structures 120 may be sacrificial structures formed in a region in which the gate dielectric layer 163 and the gate electrode 165 are disposed, on the channel layers 140, in a subsequent process, as illustrated in FIG. 1B. The sacrificial gate structure 120 may include sequentially stacked first and second sacrificial gate layers 123 and 125, and a mask pattern layer 126. The first and second sacrificial gate layers 123 and 125 may be patterned using the mask pattern layer 126. The first and second sacrificial gate layers 123 and 125 may be an insulating layer and a conductive layer, respectively, but are not limited thereto, and the first and second sacrificial gate layers 123 and 125 may be formed as one layer. For example, the first sacrificial gate layer 123 may include silicon oxide, and the second sacrificial gate layer 125 may include polysilicon. The mask pattern layer 126 may include silicon oxide and/or silicon nitride. The sacrificial gate structures 120 may have a line shape that intersects the active structures and extends in one direction. The sacrificial gate structures 120 may extend, for example, in the Y-direction and may be disposed to be spaced apart from each other in the X-direction.

The sacrificial gate structure 120 may further include a gate spacer layer 164 and a spacer pattern 174 covering side surfaces of the sacrificial stack structure that forms the first and second sacrificial gate layers 123 and 125 and the mask pattern layer 126. The gate spacer layers 164 may be formed on both sidewalls of the sacrificial stack structure in the narrow fin region NS and the wide fin region WS. The spacer patterns 174 may be formed on both sidewalls of the sacrificial stack structure in the transition region TS. The gate spacer layers 164 and the spacer patterns 174 may be formed by forming a film having a uniform thickness along upper and side surfaces of the active structures and the sacrificial stack structure and then performing anisotropic etching thereon. The gate spacer layers 164 and the spacer patterns 174 may be formed of a low-k material, and may include at least one of, for example, SiO, SiN, SiCN, SiOC, SiON, and SiOCN.

The sacrificial gate structure 120 may include a first sacrificial gate structure 120A intersecting the first active region 105N, a second sacrificial gate structure 120B intersecting the second active region 105W, and a third sacrificial gate structure 120T intersecting at least a portion of the connection region 105T. In the third sacrificial gate structure 120T, a width MW1 of a central portion in the X-direction may be greater than a width MW2 of an edge portion in the X-direction. The sacrificial gate structure 120 may be formed, for example, by performing an extreme ultraviolet (EUV) lithography process. Unlike the first and second sacrificial gate structures 120A and 120B, the third sacrificial gate structure 120T may be formed to have various shapes. By forming the third sacrificial gate structure 120T to have various shapes, some example embodiments of the present specification may be provided.

Figure 12:
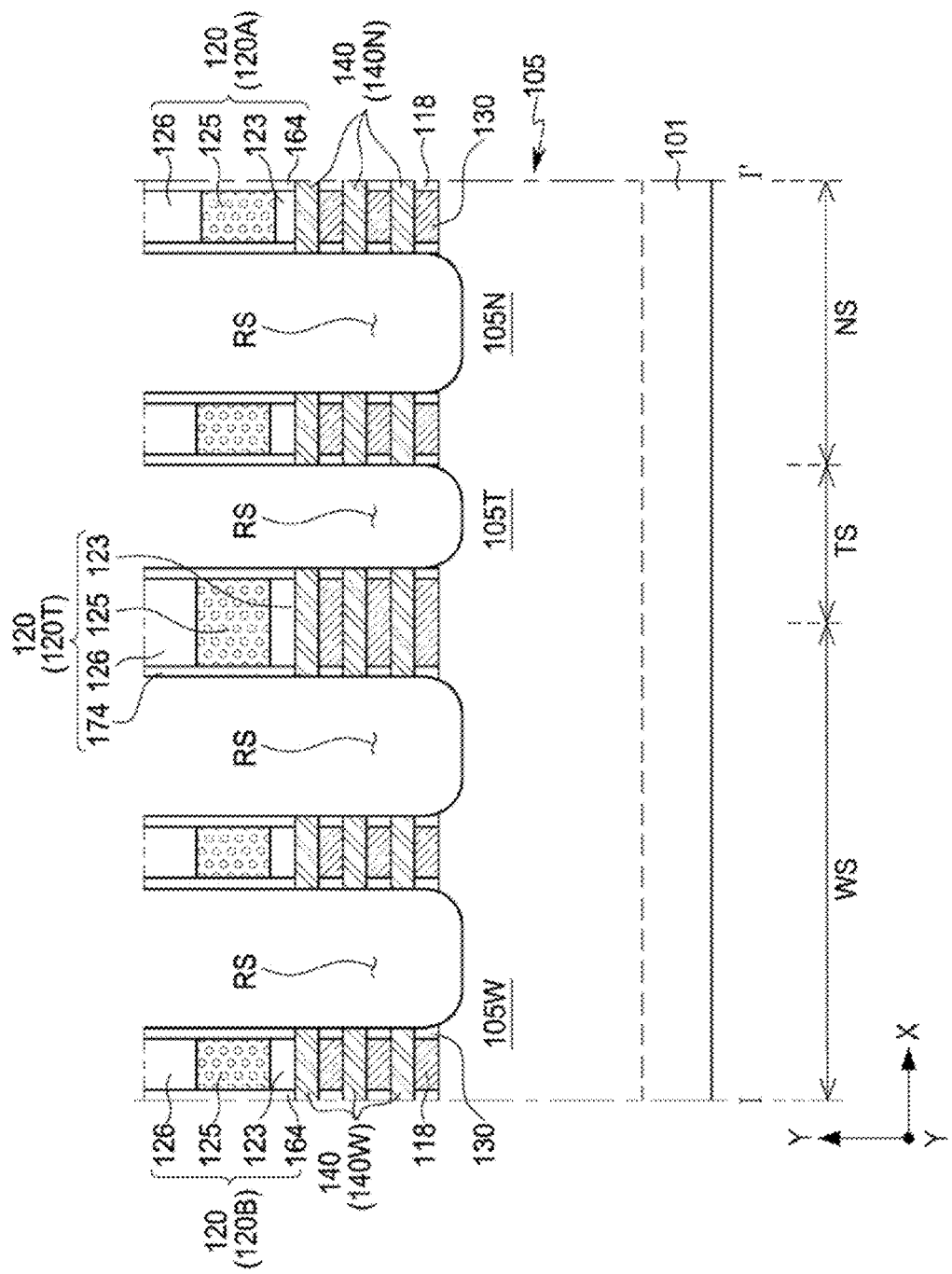

FIG. 12 is a cross-sectional view illustrating a semiconductor device according to some example embodiments. FIG. 12 illustrates a cross-sectional view corresponding to line I-I' shown in FIG. 11A.

Referring to FIG. 12, the channel layers 140 may be formed by removing the exposed sacrificial layers 118 and channel layers 140 between the sacrificial gate structures 120 to form a recess RS, and inner spacer layers 130 may be formed.

First, the exposed sacrificial layers 118 and channel layers 140 may be partially removed by using the sacrificial gate structures 120 as masks. Accordingly, the channel layers 140 have a limited length in the X-direction and form the channel layers 140 of FIG. 1B. In another example, below the sacrificial gate structures 120, the sacrificial layers 118 and the channel layers 140 are partially removed from side surfaces in such a manner that both sides in the X-direction are located below the sacrificial gate structures 120.

Next, the sacrificial layers 118 exposed by the recess RS may be partially removed from the side surface, and the inner spacer layers 130 may be formed in the region from which the sacrificial layers 118 have been removed. The sacrificial layers 118 may be selectively etched with respect to the channel layers 140 by, for example, an etching process, and partially removed from the side surface in the X-direction. The sacrificial layers 118 may have inwardly concave side surfaces by side etching as described above. However, the shape of the side surface of the sacrificial layers 118 is not limited to that illustrated. The inner spacer layers 130 may be formed by filling an insulating material in a region from which the sacrificial layers 118 are partially removed and removing the insulating material deposited on the outer side of the channel layers 140. The inner spacer layers 130 may be formed of the same material as the gate spacer layers 164, but the configuration is not limited thereto. For example, the inner spacer layers 130 may include at least one of SiN, SiCN, SiOCN, SiBCN, and SiBN. However, in some embodiments, the process of forming the inner spacer layers 130 may be omitted.

Figure 13:
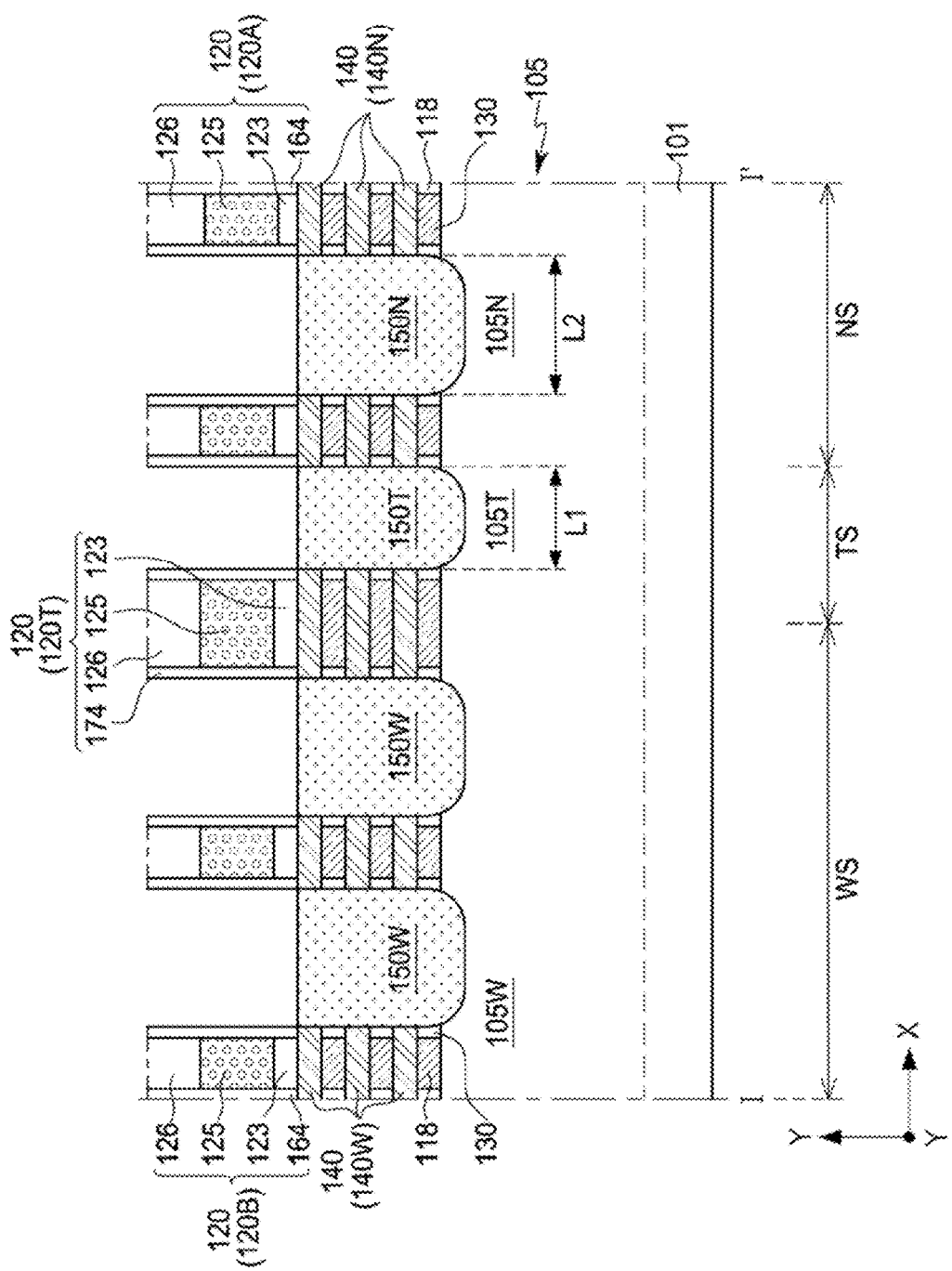

FIG. 13 is a cross-sectional view illustrating a semiconductor device according to some example embodiments. FIG. 13 illustrates a cross-sectional view corresponding to line I-I' shown in FIG. 11A.

Referring to FIG. 13, source/drain regions 150 may be formed on the active region 105, on both sides of the sacrificial gate structures 120.

The source/drain regions 150 may be formed by performing an epitaxial growth process in the recess RS. The source/drain regions 150 may be connected to the plurality of channel layers 140 through side surfaces. The upper surfaces of the source/drain regions 150 may be disposed on substantially the same level as the upper surface of the upper channel layer 140 (e.g., uppermost channel layer 140 in the Z-direction), but the configuration is not limited thereto, and may be disposed on a higher level. The source/drain regions 150 may include impurities by in-situ doping, and may also include a plurality of layers having different doping elements and/or doping concentrations. The first source/drain region 150T may be formed to have a length L1 greater than a length L2 of the second source/drain region 150N. By forming the shape of the third sacrificial gate structure 120T as illustrated in FIG. 11A, a volume reduction may be induced during epitaxial growth of the first source/drain region 150T. Accordingly, the first source/drain region 150T may be formed to have a volume similar to or substantially the same as that of the second source/drain region 150N.

Figure 14A:
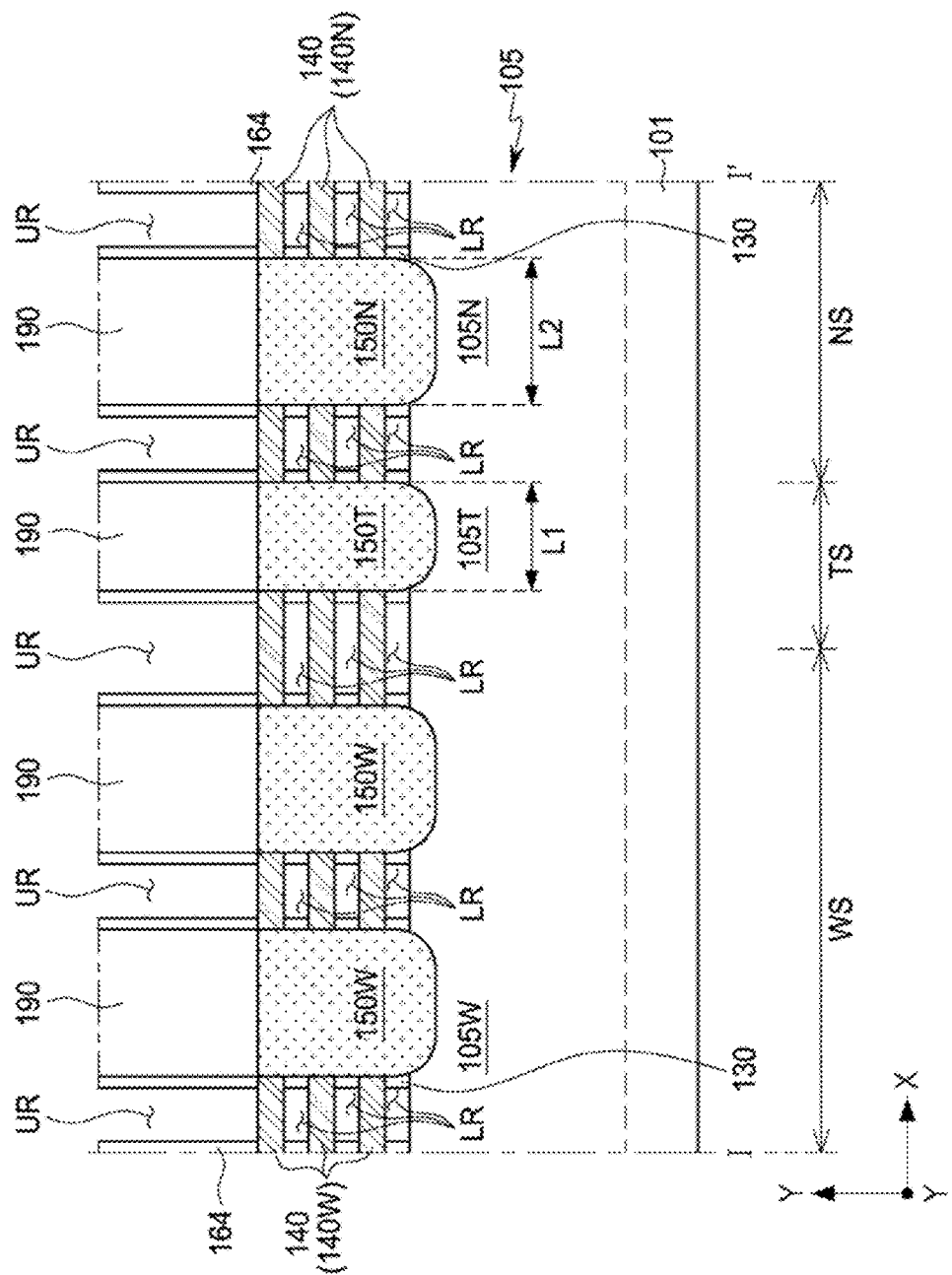
Figure 14B:
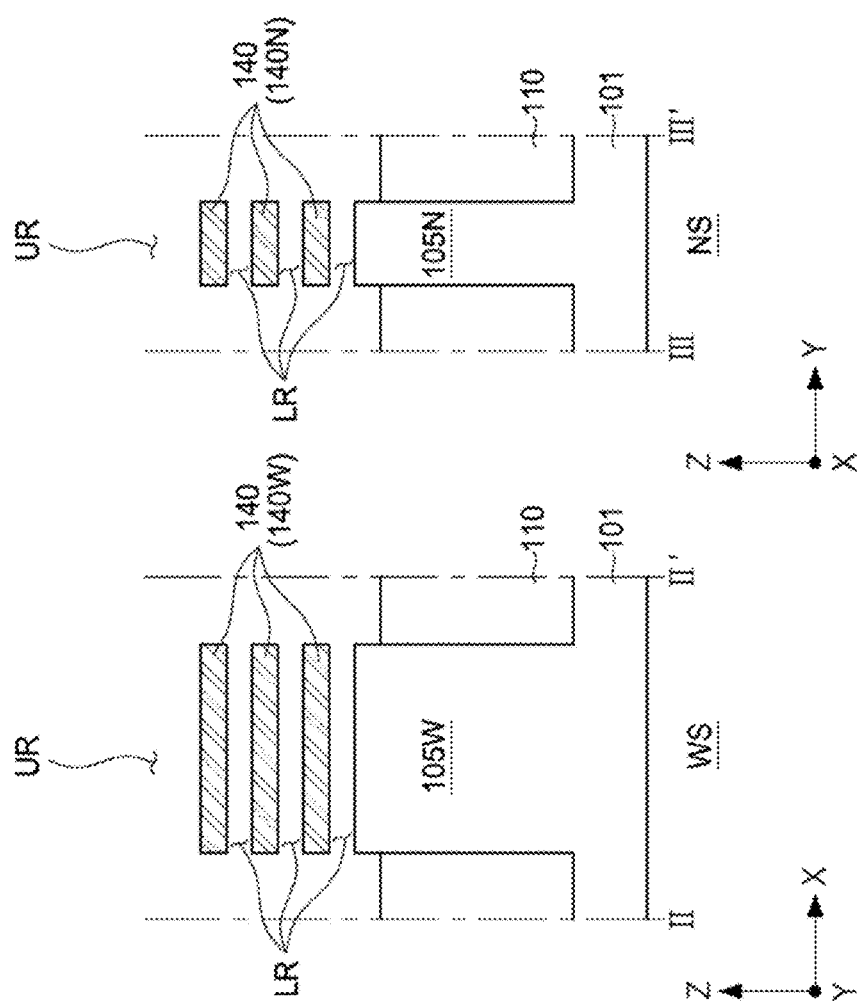

FIGS. 14A and 14B are cross-sectional views illustrating a semiconductor device according to some example embodiments. FIG. 14A illustrates a cross-sectional view corresponding to line I-I' shown in FIG. 11A. FIG. 14B illustrates cross-sectional views corresponding to lines II-II' and III-III' shown in FIG. 11A.

Referring to FIGS. 14A and 14B, an interlayer insulating layer 190 may be formed on the source/drain regions 150, and the first and second sacrificial gate layers 123 and 125, the mask pattern layer 126, and the sacrificial layers 118 may be removed.

The interlayer insulating layer 190 may be partially formed by forming an insulating layer covering the sacrificial gate structures 120 and the source/drain regions 150, and performing a planarization process to expose the upper surface of the mask pattern layer 126.

The first and second sacrificial gate layers 123 and 125, the mask pattern layer 126, and the sacrificial layers 118 may be selectively removed with respect to gate spacer layers 164, spacer patterns 174, the interlayer insulating layer 190, and the channel layers 140. First, upper gap regions UR are formed by removing the first and second sacrificial gate layers 123 and 125 and the mask pattern layer 126, and then, the sacrificial layers 118 exposed through the upper gap regions UR may be removed, thereby forming lower gap regions LR.

Figure 15:
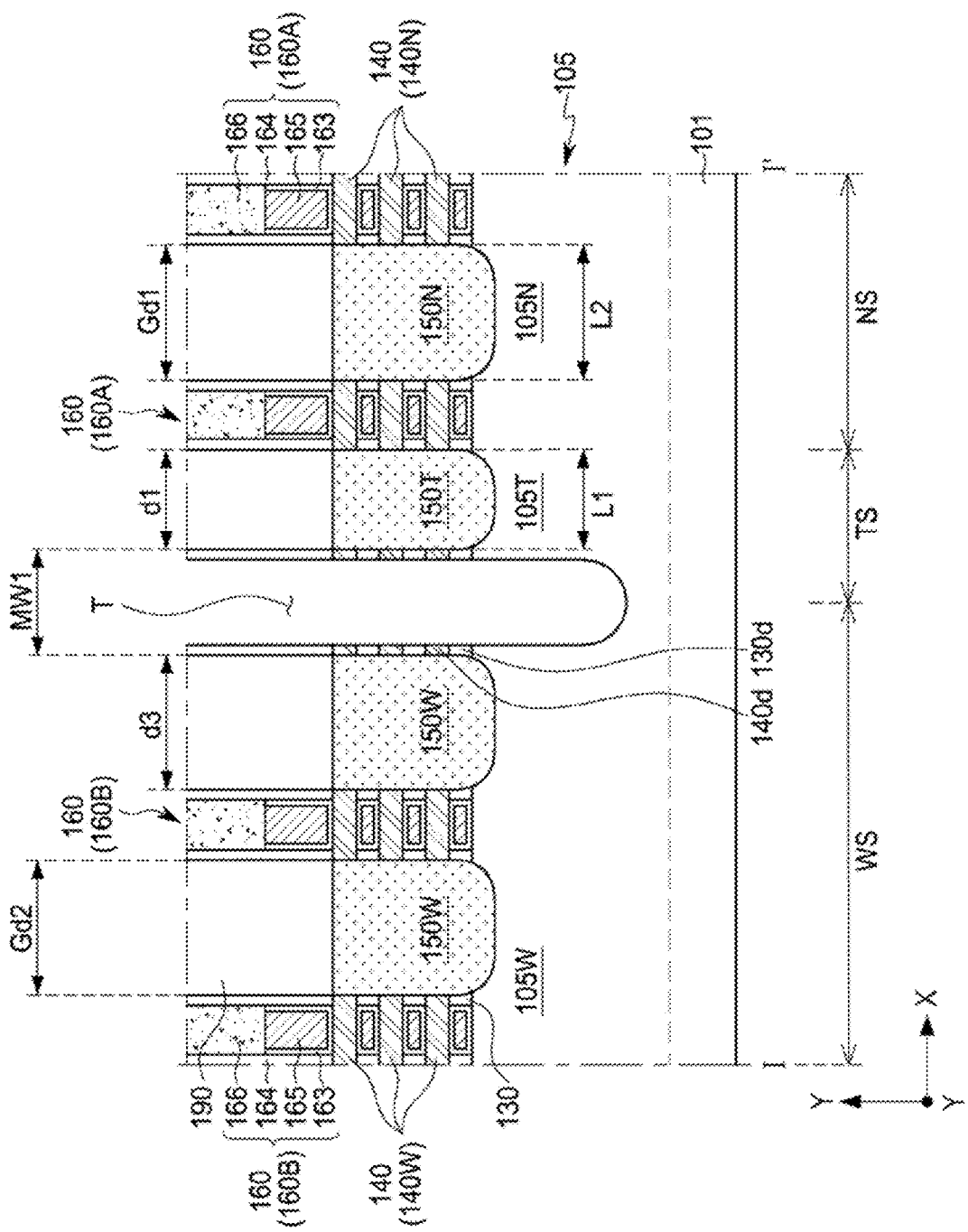

FIG. 15 is a cross-sectional view illustrating a semiconductor device according to some example embodiments. FIG. 15 illustrates a cross-sectional view corresponding to line I-I' shown in FIG. 11A.

Referring to FIG. 15, a gate dielectric layer 163 and the gate electrode 165 may be formed in the upper gap regions UR and the lower gap regions LR.

The gate dielectric layers 163 may be formed to conformally cover inner surfaces of the upper gap regions UR and the lower gap regions LR. After the gate electrodes 165 may be formed to completely fill the upper gap regions UR and the lower gap regions LR, the gate electrodes 165 may be removed from the upper portion of the upper gap regions UR to a particular (or, alternatively, predetermined) depth. A gate capping layer 166 may be formed in the region in which the gate electrodes 165 have been removed from the upper gap regions UR. Accordingly, gate structures 160 including the gate dielectric layer 163, the gate electrode 165, the gate spacer layers 164, and the gate capping layer 166 may be formed. Thereafter, the interlayer insulating layer 190 may be additionally formed.

In this operation, the dummy structure 170' may be formed with the dummy gate dielectric layer 173, the dummy gate electrode 175, the dummy gate capping layer 176 and the spacer pattern 174 as illustrated in FIG. 7 by performing process operations preceding the third sacrificial gate structure 120T. Alternatively, in a manner different therefrom, in this operation, after the dummy structure 170' is formed, as illustrated in FIG. 13, a trench T may be formed by Removing a portion of the channel layer 140 and a portion of the active region 105 together with the dummy gate dielectric layer 173, the dummy gate electrode 175, and the dummy gate capping layer 176 of the dummy structure 170'. A spacer pattern 174, inner spacer layers 130d, and dummy channel layers 140d may remain around the trench T. When the trench T is formed, the spacer pattern 174, the inner spacer layers 130d and the dummy channel layers 140d may be removed.

Next, the insulating isolation pattern 178 filling the trench T may be formed to form the dummy structure 170, and a contact structure 180 may be formed, thereby manufacturing the semiconductor device 100a of FIGS. 1A to 1C.

As set forth above, by modifying the shape of the dummy structure, a difference in volume between source/drain regions around a region in which the width of the active region changes may be significantly reduced, thereby providing a semiconductor device having improved electrical characteristics and reliability.

While some example embodiments have been illustrated and described above, it will be apparent to those skilled in the art that modifications and variations could be made without departing from the scope of the present inventive concepts as defined by the appended claims.

What is claimed is:

1. A semiconductor device, comprising:
a first active region extending in a first direction and having a first width in a second direction, the second direction being perpendicular to the first direction;
a second active region extending in the first direction and having a second width in the second direction, the second width being greater than the first width;
a connection region connected to both of the first active region and the second active region, the connection region having a third width in the second direction, the third width being greater than the first width and less than the second width;
a first gate structure intersecting the first active region and extending in the second direction;
a second gate structure intersecting the second active region and extending in the second direction;
a dummy structure intersecting at least a portion of the connection region, the dummy structure extending in the second direction, the dummy structure being between the first and second gate structures in the first direction; and
source/drain regions on the first active region, the second active region, and the connection region, the source/drain regions being on at least one side of each of the first and second gate structures and at least one side of the dummy structure,
wherein the dummy structure includes
a first pattern portion isolated from direct contact with a side surface of the first gate structure by a first distance in the first direction, and
a second pattern portion isolated from direct contact with the side surface of the first gate structure by a second distance in the first direction, the second distance being greater than the first distance.

2. The semiconductor device of claim 1, wherein the first pattern portion is closer to the first gate structure than the second pattern portion in the first direction.

3. The semiconductor device of claim 1, wherein
the first pattern portion has a first maximum width in the first direction,
the second pattern portion has a second maximum width in the first direction, and
the first maximum width is greater than the second maximum width.

4. The semiconductor device of claim 3, wherein the first maximum width of the first pattern portion is greater than both a maximum width of the first gate structure in the first direction and a maximum width of the second gate structure in the first direction.

5. The semiconductor device of claim 3, wherein the dummy structure further includes a bent portion based on a difference in width in the first direction between the first maximum width and the second maximum width.

6. The semiconductor device of claim 1, wherein the connection region includes a particular portion that at least partially defines a side surface of the connection region that is inclined based on a variation, in the first direction, of a width of the portion of the connection region in the second direction.

7. The semiconductor device of claim 1, wherein the dummy structure is asymmetrical with respect to a centerline in the second direction of the second pattern portion.

8. The semiconductor device of claim 1, wherein
the first gate structure includes a first portion overlapping the first pattern portion in the first direction and a second portion overlapping the second pattern portion in the first direction, and
a side surface of the first portion and a side surface of the second portion extend in parallel with each other.

9. The semiconductor device of claim 1, further comprising:
a plurality of first channel layers on the first active region, the plurality of first channel layers being vertically spaced apart from each other, the plurality of first channel layers being at least partially surrounded by the first gate structure; and
a plurality of second channel layers on the second active region, the plurality of second channel layers being vertically spaced apart from each other, the plurality of second channel layers being at least partially surrounded by the second gate structure,
wherein a width of each of the plurality of first channel layers in the second direction is less than a width of each of the plurality of second channel layers in the second direction.

10. The semiconductor device of claim 1, wherein
the dummy structure includes an insulating isolation pattern and a spacer pattern covering at least one side of the insulating isolation pattern, and
a lower end of the insulating isolation pattern is at a lower level than an upper end of each of the first and second active regions and the connection region.

11. The semiconductor device of claim 10, further comprising:
a device isolation layer extending in the second direction and covering a lower portion of side surfaces of each of the first active region, the second active region, and the connection region, and
wherein the lower end of the insulating isolation pattern is at a different level than a level of a lower end of the device isolation layer.

12. A semiconductor device comprising:
an active region extending in a first direction on a substrate, the active region including
a first active region having a first width in a second direction, the second direction being perpendicular to the first direction,
a second active region having a second width in the second direction, the second width being greater than the first width, and
a connection region between the first active region and the second active region, the connection region having an inclined surface at least partially defined by a difference between the first width and the second width;
a gate structure intersecting the first active region and extending in the second direction;
a dummy structure intersecting the connection region, the dummy structure extending in the second direction, the dummy structure being adjacent to the gate structure;
a first source/drain region on the connection region, the first source/drain region between a first side of the gate structure and a first side of the dummy structure; and
a second source/drain region on the first active region, the second source/drain region on a second side of the gate structure opposing the first side,
wherein the first source/drain region has a first length in the first direction,
wherein the second source/drain region has a second length in the first direction, and
wherein the first length is less than the second length.

13. The semiconductor device of claim 12, wherein a maximum width of the first source/drain region in the second direction is greater than a maximum width of the second source/drain region in the second direction.

14. The semiconductor device of claim 12, wherein
the first source/drain region is asymmetrical with respect to a centerline, and
the centerline extends in the second direction, between opposite ends of the first source/drain region facing each other in the first direction.

15. The semiconductor device of claim 12, wherein a width of the connection region in the second direction continuously decreases from the second active region toward the first active region.

16. The semiconductor device of claim 12, wherein the first side of the dummy structure includes
a first surface that is in contact with the first source/drain region,
a second surface that is bent from the first surface, and
a third surface that is bent from the second surface, the third surface extending in the second direction.

17. The semiconductor device of claim 16, wherein in the first direction, a first distance between the first surface of the dummy structure and the first side of the gate structure is less than a second distance between the third surface of the dummy structure and the first side of the gate structure.

18. A semiconductor device, comprising:
an active region extending in a first direction on a substrate, the active region including
a first active region having a first width in a second direction, the second direction being perpendicular to the first direction,
a second active region having a second width in the second direction, the second width being greater than the first width, and
a connection region between the first active region and the second active region, the connection region having an inclined surface at least partially defined by a difference between the first width and the second width;
a first gate structure intersecting the first active region and extending in the second direction;
a plurality of first channel layers on the first active region, the plurality of first channel layers being vertically spaced apart from each other, the plurality of first channel layers being at least partially surrounded by the first gate structure;
a second gate structure intersecting the second active region and extending in the second direction;
a plurality of second channel layers on the second active region, the plurality of second channel layers being vertically spaced apart from each other, the plurality of second channel layers being at least partially surrounded by the second gate structure; and
a dummy structure intersecting the connection region, the dummy structure extending in the second direction, the dummy structure being between the first and second gate structures in the first direction,
wherein the dummy structure includes
a first pattern portion isolated from direct contact with a side surface of the first gate structure by a first distance in the first direction, and
a second pattern portion isolated from direct contact with the side surface of the first gate structure by a second distance in the first direction, the second distance being greater than the first distance.

19. The semiconductor device of claim 18, wherein the connection region includes a portion that at least partially defines an inclined side surface of the connection region that is inclined based on a variation, in the first direction, of a width of the portion of the connection region in the second direction.

20. The semiconductor device of claim 19, wherein
the first pattern portion is closer to the first gate structure than the second pattern portion in the first direction, and
the first pattern portion at least partially overlaps the inclined side surface.

* * * * *